US008525619B1

(12) United States Patent
Olsson et al.

(10) Patent No.: US 8,525,619 B1
(45) Date of Patent: Sep. 3, 2013

(54) LATERAL ACOUSTIC WAVE RESONATOR COMPRISING A SUSPENDED MEMBRANE OF LOW DAMPING RESONATOR MATERIAL

(75) Inventors: Roy H. Olsson, Albuquerque, NM (US); Ihab F. El-Kady, Albuquerque, NM (US); Maryam Ziaei-Moayyed, San Francisco, CA (US); Darren W. Branch, Albuquerque, NM (US); Mehmet F. Su, Albuquerque, NM (US); Charles M. Reinke, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 434 days.

(21) Appl. No.: 12/790,303

(22) Filed: May 28, 2010

(51) Int. Cl.
*H03H 9/54* (2006.01)

(52) U.S. Cl.
USPC .......................................... 333/187; 310/324

(58) Field of Classification Search
USPC .......... 333/187, 186, 191, 141, 149; 310/324
See application file for complete search history.

(56) References Cited

U.S. PATENT DOCUMENTS

| | | | | |
|---|---|---|---|---|
| 5,668,303 | A | * | 9/1997 | Giesler et al. ................. 73/24.06 |
| 6,028,389 | A | * | 2/2000 | Bernstein ...................... 310/324 |
| 6,121,856 | A | * | 9/2000 | Apostolos ..................... 333/141 |
| 7,109,633 | B2 | * | 9/2006 | Weinberg et al. ......... 310/313 B |
| 7,616,077 | B1 | | 11/2009 | Wittwer et al. | 
| 7,652,547 | B1 | | 1/2010 | Wittwer et al. |
| 2008/0246559 | A1 | * | 10/2008 | Ayazi et al. ................... 333/187 |

OTHER PUBLICATIONS

Fleming, "Microfabricated Bulk Wave Acoustic Bandgap Device," U.S. Appl. No. 11/748,832, filed May 15, 2007.
Olsson, "Microfabricated Bulk Wave Acoustic Bandgap Device, "U.S. Appl. No. 12/764,700, filed Apr. 21, 2010.
Bailey, "Frequency Stability of High Overtone Bulk Acoustic Resonators," 1990 Ultrasonics Symposium—509-512.
Chandrahalim, "Influence of Silicon on Quality Factor, . . . "Solid-State Sensors, Actuators, and Microsystems Workshop, Hilton Head Island, S. Carolina, Jun. 1-5, 2008, 360-363.
Chandorkar, "Limits of Quality Factor in Bulk-Mode Micromechanical Resonators," MEMS 2008, Tucson, AZ, Jan. 13-17, 2008, 74-77.
Ho, "Process Compensated Micromechanical Resonators," MEMS 2007, Kobe, Japan, Jan. 21-25, 2007, 183-186.
Kline, "Overmoded High Q Resonators for Microwave Oscillators," 1993 IEEE International Frequency Control Symposium, 718-721.
Olsson, "Post-CMOS Compatible Aluminum Nitride MEMS Filters and Resonant Sensors," 2007 IEEE, Sandia National Laboratories, Albuquerque, NM, 412-419.

(Continued)

*Primary Examiner* — Benny Lee
(74) *Attorney, Agent, or Firm* — Kevin W. Bieg

(57) ABSTRACT

A very high-Q, low insertion loss resonator can be achieved by storing many overtone cycles of a lateral acoustic wave (i.e., Lamb wave) in a lithographically defined suspended membrane comprising a low damping resonator material, such as silicon carbide. The high-Q resonator can sets up a Fabry-Perot cavity in a low-damping resonator material using high-reflectivity acoustic end mirrors, which can comprise phononic crystals. The lateral overtone acoustic wave resonator can be electrically transduced by piezoelectric couplers. The resonator Q can be increased without increasing the impedance or insertion loss by storing many cycles or wavelengths in the high-Q resonator material, with much lower damping than the piezoelectric transducer material.

19 Claims, 22 Drawing Sheets

(56) References Cited

OTHER PUBLICATIONS

Olsson, "VHF and UHF Mechanically Coupled Aluminum Nitride MEMS Filters," 2008 IEEE, Sandia National Laboratories, Albuquerque, NM, 634-639.

Olsson, "Microfabricated phononic crystal devices and applications," Measurement Science and Technology, 20, (2009) 012002, 1-13, 2009 IOP Publishing.

Pan, "A Low-Loss 1.8GHZ Monolithic Thin-Film Piezoelectric-On-Substrate Filter," MEMS 2008, Tucson, AZ, Jan. 13-17, 2008, 176-179.

Piazza, "Single-Chip Multiple-Frequency ALN MEMS Filters Based on Contour-Mode Piezoelectric Resonators," Journal of Microelectromechanical Systems, 16, 2, Apr. 2007, 319-328.

* cited by examiner

LATERAL ACOUSTIC WAVE RESONATOR COMPRISING A SUSPENDED MEMBRANE OF LOW DAMPING RESONATOR MATERIAL

STATEMENT OF GOVERNMENT INTEREST

This invention was made with Government support under contract no. DE-AC04-94AL85000 awarded by the U.S. Department of Energy to Sandia Corporation. The Government has certain rights in the invention.

FIELD OF THE INVENTION

The present invention relates to radiofrequency resonators and, in particular, to a lateral acoustic wave resonator that can achieve a high quality factor.

BACKGROUND OF THE INVENTION

Highly selective radiofrequency (RF) filters are used in a variety of applications to avoid interference between adjacent bands, including TV broadcasting, GPS systems, mobile phone systems, and wireless local area networks. For example, mobile phones need RF filters to protect the sensitive receive path from interference by transmit signals from other users and noise from various RF sources. Bandpass RF filters operate in the 100 MHz to 10 GHz frequency range and preferably have extremely low losses and high quality factors (Q). In particular, RF communication and radar systems rely on high-Q resonator filters at increasingly high (>1 GHz) frequencies. Further, filters need to have a specified impedance level at the input and output ports. Many systems work at 50Ω impedance level, because this is a reasonable compromise between the size and performance of components and the currents and voltages occurring inside the system. See R. Aigner, "MEMS in RF filter applications: thin-film bulk acoustic wave technology," *Sensors Update* 12(1), 175 (2003).

Previous research has demonstrated that arrays of low-impedance, temperature-compensated piezoelectric lateral microresonators spanning the very high (VHF: 30-300 MHz) and ultra high (UHF: 300-3000 MHz) frequency range can be realized in a compact size on a single chip. See R. H. Olsson III et al., "Post-CMOS compatible aluminum nitride MEMS filters and resonant sensors," *IEEE Freq. Cntl. Sym.*, 412 (2007); R. H. Olsson III et al, "VHF and UHF mechanically coupled aluminum nitride MEMS filters," *IEEE Freq. Cntl. Sym.*, 634 (2008); G. Piazza et al., "Single-chip multiple frequency AlN MEMS filters based on contour-mode piezoelectric resonators," *J. of Microelectromech. Syst.*, 16(2), 319 (2007); and W. Pan et al., "A low-loss 1.8 GHz monolithic thin-film piezoelectric-on-substrate filter," *Proc. IEEE Conf. on Microelectromechanical Sys.*, 176 (2008). These piezoelectric microresonators exhibit maximum Qs of a few thousand, limited by anchor losses, material damping in the metal electrodes used to transduce the devices and, especially in the case of lead zirconate titanate (PZT) resonators, by material damping in the piezoelectric layer.

The piezoelectric coupling coefficient $k_t^2$ determines the degree of coupling between the electrical and mechanical domains. Both high $k_t^2$ and high Q are desired to enable the widest range of filters to be designed (i.e., wide and narrow bandwidths with steep filter skirts). Aluminum nitride (AlN) and zinc oxide (ZnO) have been the materials of choice for piezoelectric microelectromechanical systems (MEMS) resonators because of their high coupling coefficients and quality factors; i.e., their $k_t^2 Q$ products. See H. Chandrahalim et al. "Influence of silicon on quality factor, motional impedance and tuning range of PZT-transduced resonators," *Solid-State Sensors, Actuators and Microsystems Workshop*, 360 (2008). Dielectric losses at frequencies in excess of 1 GHz have been shown to limit the performance of ZnO based resonator designs. However, at frequencies >1 GHz, AlN is an excellent insulator. Ceramics, such as PZT, exhibit slightly higher coupling coefficients; however, high material damping limits their application, particularly at high frequencies. The highest reported fQ products for PZT resonators are $4\times10^{11}$ with a $k_t^2$ of 9%. This is a factor of nearly 20 lower in performance compared to AlN with $fQ=10^{13}$ and $k_t^2=6.5\%$. See W. Pan et al. Here, f is the resonant frequency and Q is the quality factor of the acoustic resonance (i.e., the quality factor in a resonator is the ratio of the energy stored to lost energy per cycle or, equivalently, the resonator's bandwidth relative to its center resonant frequency, $f/\Delta f$).

Despite significant progress in the MEMS community, the highest Q devices available today are relatively large overtone bulk acoustic wave (BAW) devices. See G. R. Kline et al., "Overmoded high-Q resonators for microwave oscillators," *IEEE Freq. Cntl. Sym.*, 718 (1993). These thickness-mode BAW resonators comprise a piezoelectric resonator in which a vertical acoustic wave is generated within the piezolayer itself. The commercial community has refined thickness-mode resonators and evolved several variants, including solidly mounted resonators (SMRs), which include Bragg mirrors, and film-bulk acoustic resonators (FBARs). The resonant frequency is determined primarily by the thickness of the piezolayer, and by the electrodes and any additional mechanical layers. Resonators with resonant frequencies in the GHz range can have plate thicknesses of less than a few microns. The resonant frequency of these devices is very sensitive to the film thickness, which in today's best atomic layer deposition systems is still limited to the range of 0.1%, translating to 1-nm uniformity in a 1-μm thick film. Numerical, analytical, and experimental data place the sensitivity of fundamental thickness mode device frequencies on the order of 1 MHz/nm of film thickness. Therefore, the resonant frequency and bandwidth of thickness-mode resonators are difficult to control.

Therefore, a need remains for a resonator that can achieve a high Q factor with a narrow bandwidth in the GHz range, can maintain a low impedance level for low loss and RF power transmission, and can be lithographically defined using MEMS and CMOS compatible fabrication processes.

SUMMARY OF THE INVENTION

The present invention is directed to a lateral acoustic wave resonator, comprising a membrane, comprising a low damping resonator material, suspended from a substrate; and a piezoelectric transducer disposed on the membrane and adapted to generate a fundamental or overtone mode lateral acoustic wave and thereby form a standing wave resonance in the membrane. The resonator material preferably comprises a non-piezoelectric material, such as silicon carbide (SiC). SiC has a low phonon-phonon damping limit enabling high fQ product resonators. Additionally, SiC can be deposited as a thin single-crystal epitaxial or polycrystalline film and can be micromachined using MEMS processes. The piezoelectric transducer can comprise an interdigitated transducer and a layer of piezoelectric material, such as aluminum nitride (AlN). Piezoelectric actuation enables impedance matching in 50 ohm environments. Using AlN films to transduce the resonator, any impedance between 10 and 1000 ohms can be realized by lithographically scaling the transduction area. The lateral acoustic wave resonator can comprise a Fabry-Perot cavity, comprising two opposing acoustic reflector end mirrors, in the membrane, wherein the piezoelectric transducer resides outside of the cavity and wherein the standing wave resonance is formed inside the cavity. The acoustic mirrors enable decoupling of the lower-Q piezoelectric transduction material from the higher-Q resonator material in the cavity, thereby minimizing the influence of the piezoelectric material on cavity damping so as not to impact the cavity Q. The end mirrors can comprise a 1D Bragg mirror, or a 2D or 3D phononic crystal. For example, a 2D phononic crystal can comprise a periodic array of air holes in the SiC membrane. The invention enables scalability in bandwidth and frequency through advanced lithographic processes and is amenable to CMOS integration.

BRIEF DESCRIPTION OF THE DRAWINGS

The accompanying drawings, which are incorporated in and form part of the specification, illustrate the present invention and, together with the description, describe the invention. In the drawings, like elements are referred to by like numbers and may not be described in detail in all drawings in which they appear.

FIG. 13 is a graph of normalized transmission vs. frequency for longitudinal acoustic waves in a simple cubic lattice of vacuum inclusions embedded in an infinitely thick SiC plate vs. inclusion filling fraction, r/a.

FIG. 17 is a graph of the bandgap width for all acoustic waves (longitudinal, transverse, and flexural) in % vs. r/a for a simple cubic SiC/vacuum lattice with different thicknesses, t/a.

DETAILED DESCRIPTION OF THE INVENTION

A very high-Q, low insertion loss resonator can be achieved by storing many overtone cycles of a lateral acoustic wave (i.e., Lamb wave) in a lithographically defined suspended membrane comprising a low damping resonator material. A similar overtone resonator approach for increasing Q has been reported for thickness-mode BAW resonators. See G. R. Kline et al.; and D. S. Bailey et al., "Frequency stability of high overtone bulk acoustic resonators," *IEEE Ultrasonics Sym.*, 509 (1990). The low damping resonator material can comprise a non-piezoelectric material, such as silicon carbide, sapphire, yttrium aluminum garnet, or diamond. The lateral overtone acoustic wave resonator can be electrically transduced by AlN piezoelectric couplers which have previously demonstrated low impedance transduction. See R. H. Olsson III et al., *IEEE Freq. Cntl. Sym.*, 412 (2007). Similarly, other high-quality piezoelectric transducers, such as lead zirconate titanate, lithium niobate, zinc oxide, or barium strontium titanate, can be used. The resonator Q can be increased without increasing the impedance or insertion loss by storing many cycles or wavelengths in the high-Q resonator material, with much lower damping than the piezoelectric transducer material.

Figure 1:
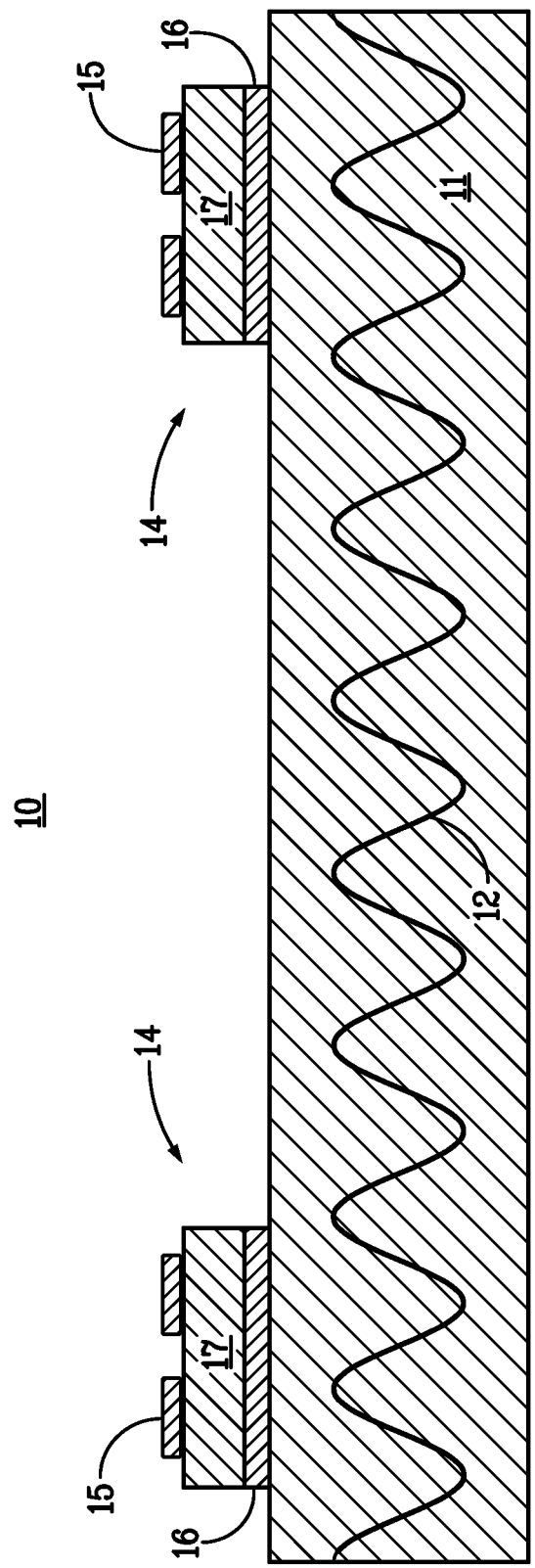
FIG. 1 is a cross-sectional side-view schematic illustration of a lateral overtone acoustic wave resonator.

FIG. 1 shows is a cross-sectional side-view schematic illustration of a lateral overtone acoustic wave resonator 10 of the present invention. Acoustic energy is coupled into and out of a thin membrane 11, comprising a high-Q resonator material, in the form of a lateral acoustic wave 12 (i.e., an elastic Lamb wave) using integrated piezoelectric transducers 14. The membrane thickness can typically be less than the acoustic wavelength, but thicker membranes can also be used. The resonator center frequency is determined by the speed of sound in the resonator material, the mode of the acoustic wave, and the membrane length. The resonator material is preferably a low-damping material enabling a high fQ product. Generally, materials with the highest fQ products are not piezoelectric, which enables greater flexibility in terms of acoustic loss, temperature coefficient, and ease of fabrication. However, this makes coupling an acoustic wave into them electrically difficult. An efficient, low-loss means to couple acoustic waves into a non-piezoelectric material is to couple a piezoelectric material to them. This effectively decreases the coupling coefficient but enables a high quality factor in the composite material system. Therefore, the acoustic wave 12 can be generated and received by the piezoelectric transducers 14 that are disposed on the resonator membrane. Each piezoelectric transducer 14 can comprise a top interdigitated transducer (IDT) 15, comprising a fingerlike periodic pattern of parallel in-plane electrodes, on the surface of a piezoelectric material layer 17, and a bottom electrode 16 on a surface of the membrane 11. The IDT 15 can selectively transduce a fundamental or an overtone mode defined by the electrode location, finger width, and finger spacing. Constructive interference occurs when the acoustic waves 12 reflected between the ends of the membrane 11 are in-phase, thereby forming a standing wave resonance in the membrane. In this resonator 10, the lower-Q piezoelectric layer 17 is within the resonator cavity, thereby affecting the overall cavity Q.

Figure 2:
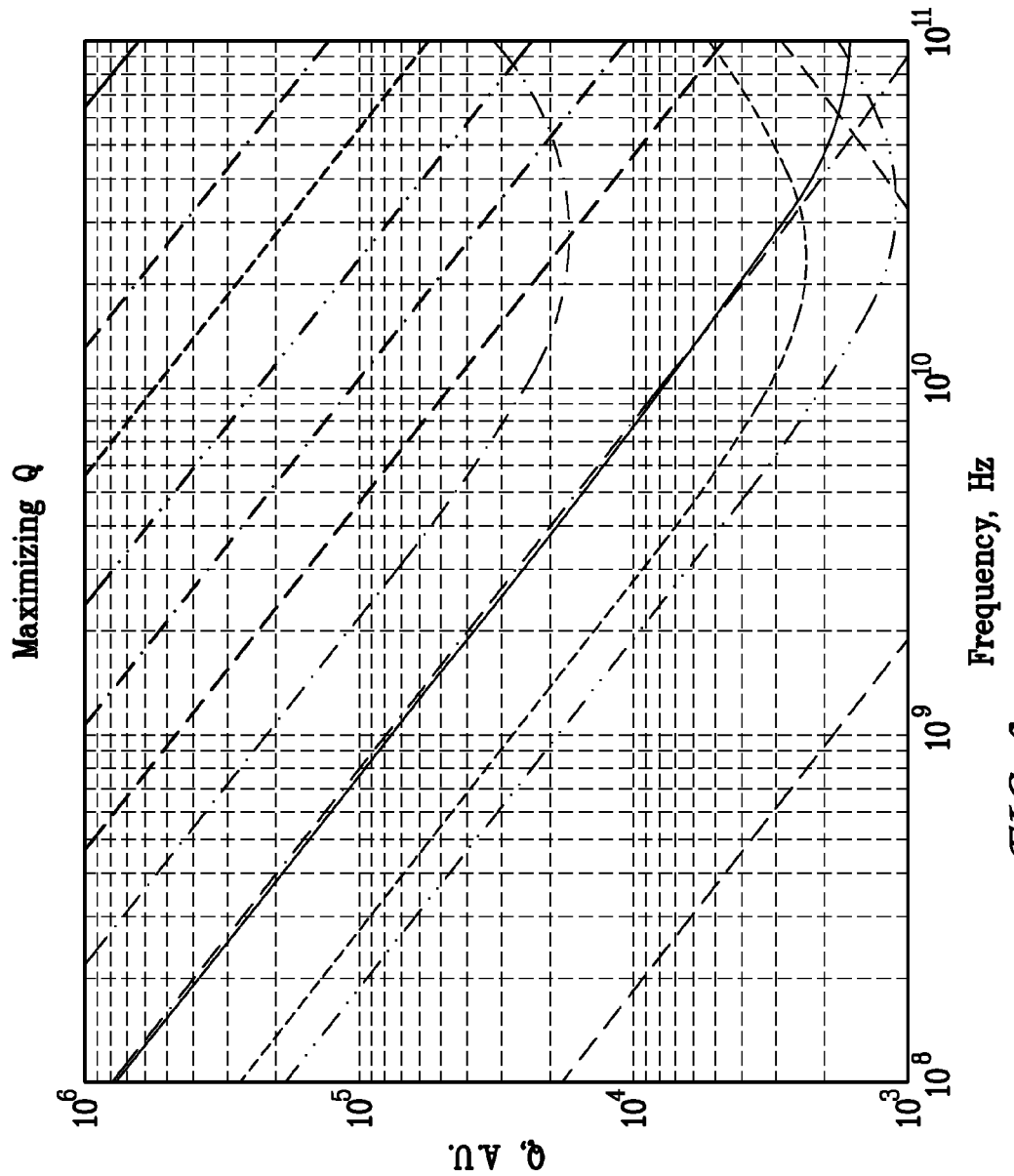
FIG. 2 is a graph of the thermo-elastic and phonon-phonon Q limits for various resonator materials.

Deformations that occur in the mechanical vibrations of a resonator are accompanied by processes that are responsible for dissipation of the oscillation energy and, therefore, reduction in the quality factor. Thermo-elastic damping is caused by vibratory volume changes producing temperature changes that are spatially inhomogeneous, inducing heat flow and the conversion of vibration energy into thermal energy. Additionally, the anharmonicity of a crystal lattice leads to phonon-phonon damping caused by the interactions between sound waves and thermal phonons. The resonator material is preferably a low-damping, non-piezoelectric material having a high fQ product. Additionally, single crystal materials are preferable to prevent scattering losses at grain boundaries. The resonator material is preferably undoped or lightly doped to prevent phonon-electron damping. FIG. 2 shows the thermo-elastic (TED) and phonon-phonon (phph) damping limits (i.e., maximum Q in arbitrary units, A. U.) in the frequency range of 100 MHz to 100 GHz for high-Q resonator materials (i.e., yttrium aluminum garnet (YAG), silicon (Si), silicon carbide (SiC), aluminum nitride (AlN), tungsten, and sapphire) calculated from V. B. Braginsky et al. and the open literature. See V. B. Braginsky et al., Systems with Small Dissipation, Univ. of Chicago Press, pp. 10-15, 1985. Phonon-phonon damping is the dominant mechanism limiting the maximum Qs for frequencies below 100 GHz (i.e., below $10^{11}$ Hz). This can be seen by observing that the line labeled "Qphph" has a lower maximum Q than the line labeled "TED" for each of these resonator materials. For frequencies below about 10 GHz (i.e., below $10^{10}$ Hz), the fundamental Q limit decreases linearly with increasing frequency. As seen by the light dot-dashed line labeled "Si Qphph", SiC has the lowest phonon-phonon damping (i.e., maximum Q) of these resonator materials and therefore can achieve the highest fQ product resonators (e.g., the phonon-phonon damping limit for SiC decreases linearly from about $10^6$ A.U. at $2\times10^8$ Hz to about $2.5\times10^4$ A.U. at $10^{10}$ Hz). Additionally, SiC can be deposited as a thin single crystal epitaxial or polycrystalline film and can be micromachined using CMOS processes. For these reasons, SiC is a preferred resonator material for achieving high-Q acoustic wave resonators. However, the resonator of the present invention can also use other high-Q non-piezoelectric materials, such as yttrium aluminum garnet (YAG), sapphire, or diamond, or piezoelectric materials. Alternatively, the resonator material can comprise a piezoelectric material.

Figure 3:
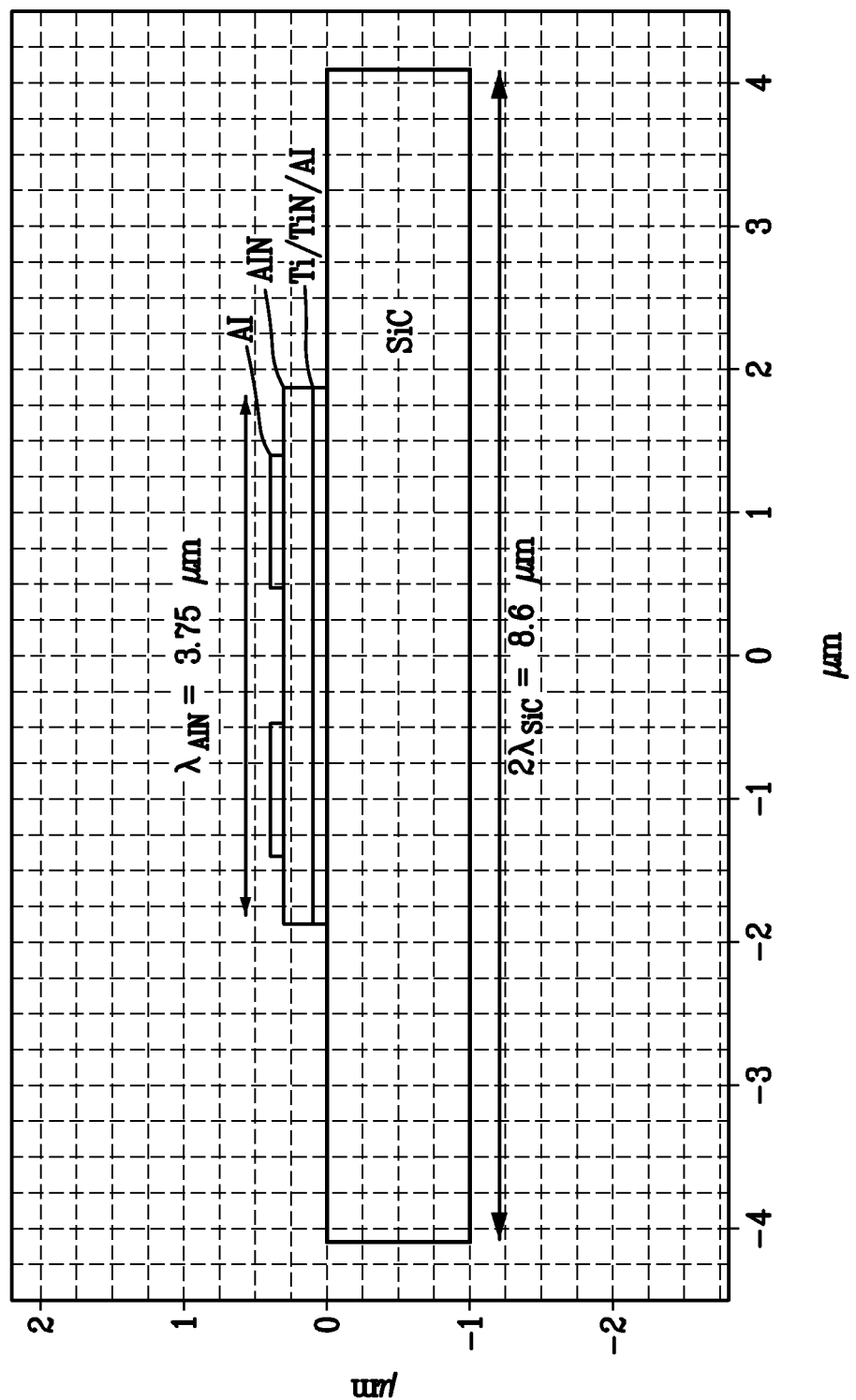
FIG. 3 is a schematic cross-section of a SiC overtone resonator transduced using a top AlN-metal piezoelectric transducer.
Figure 4A:
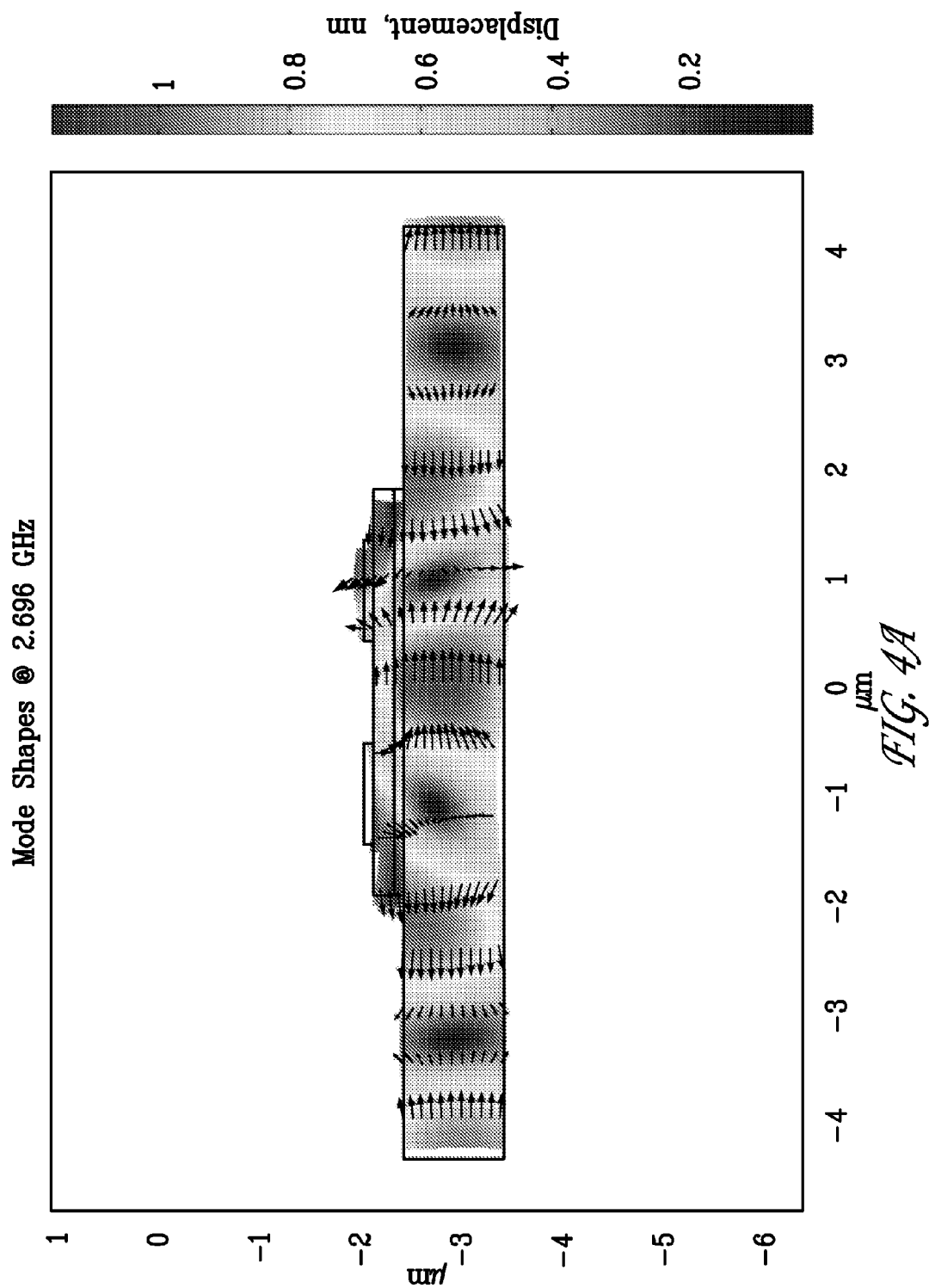
FIGS. 4A and 4B are graphs of the mode shape and frequencies using a finite element model for the resonator in FIG. 3 with 100-nm electrode, 200-nm AlN, and 1-μm SiC layer thicknesses.
Figure 4B:
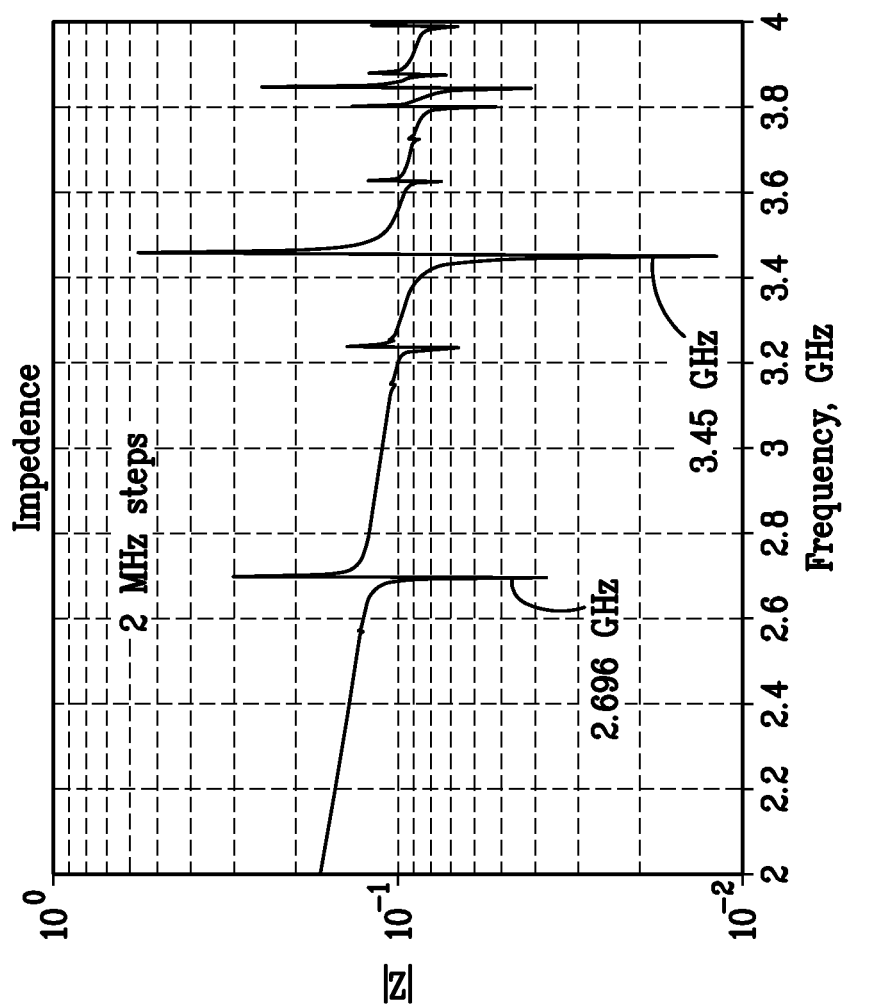

The layer thickness can be determined using finite element (FEM), finite difference time domain (FDTD), and plane wave expansion (PWE) modeling. Simulations using these models can be used to determine mode shape and impedance of the composite resonator and to determine piezoelectric material layer and electrode metal layer thicknesses that will give good coupling into the high-Q resonator material and produce few spurious signals. FIG. 3 is a schematic illustration of a FEM simulation of a 200-nm thick AlN piezoelectric material layer (element 17 in FIG. 1), 100-nm thick top and bottom electrodes (labeled Al and Ti/TiN/Al, respectively; elements 15 and 16 in FIG. 1), and a 1-μm thick SiC resonator material membrane layer (element 11 in FIG. 1). The vertical axis (i.e., thickness) and horizontal axis (i.e., length) are both shown in microns (μm). The length of the AlN transducer $\lambda_{AlN}$ is 3.75 μm and the length of the SiC resonator membrane $2\lambda_{SiC}$ is 8.6 μm in this simulation. The mode shape and impedance plots for this composite resonator are shown in FIGS. 4A and 4B. The arrows in FIG. 4A show the direction of the displacement and the scale bar to the right of the figure indicates the magnitude of the displacement at a resonant frequency of 2.696 GHz. The magnitude of the displacement is maximum in the center of the membrane, directly underneath the transducer, as indicated by the dark ovals at 1 and -1 μm on the horizontal axis. FIG. 4B shows the impedance Z as a function of frequency between 2 and 4 GHz, calculated at 2 MHz frequency steps, showing the resonant frequency at 2.696 GHz and an overtone at 3.45 GHz. Since the frequency step in this simulation is quite large, the strength of the modes can not necessarily be inferred from the plot, only the presence of a mode at that frequency. However, the mode shape for this composite resonator is quite good and there are few parasitic modes around the desired mode at 2.696 GHz.

Figure 5:
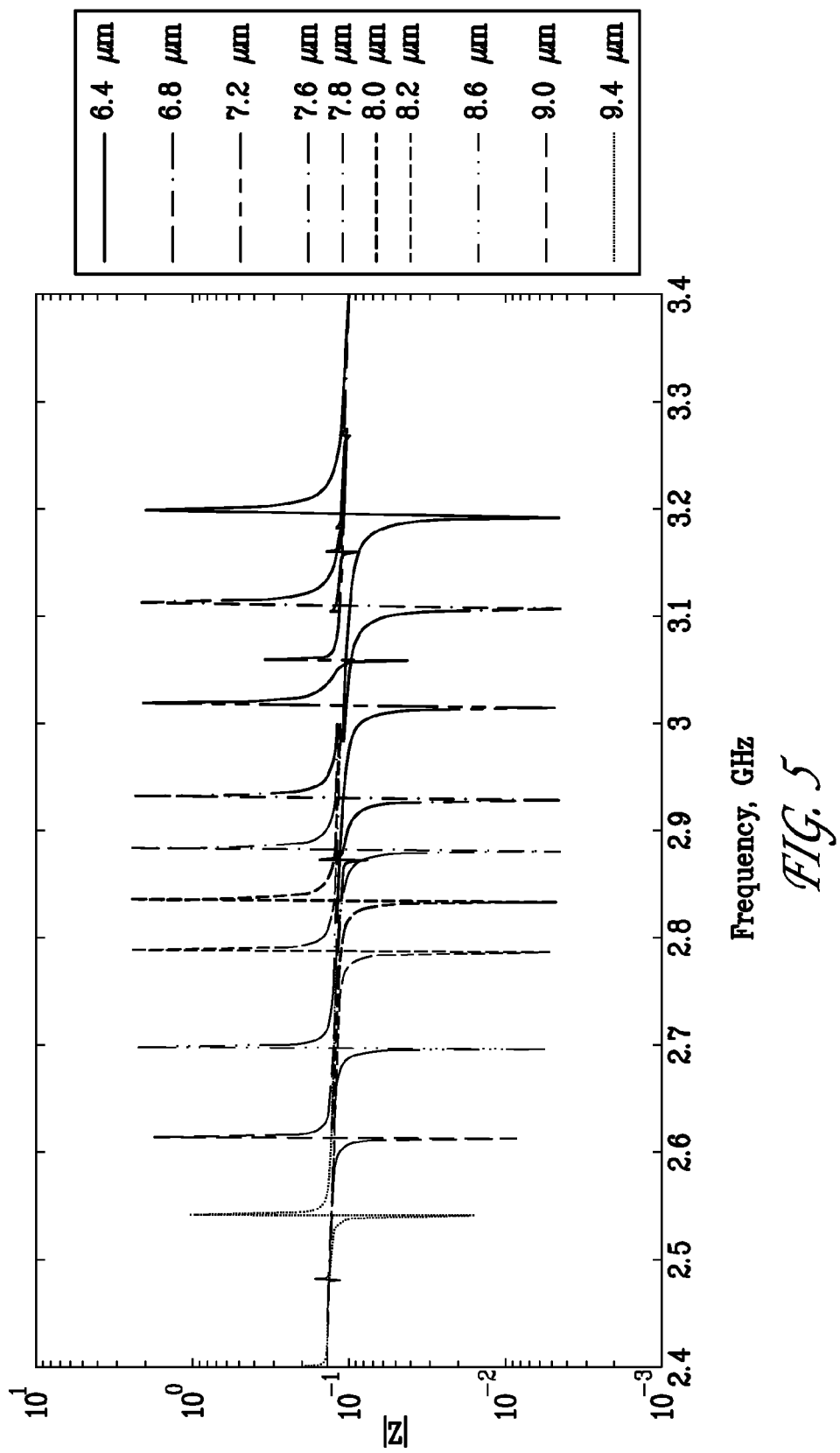
FIG. 5 is a graph of impedance versus frequency for the resonator in FIG. 3 with the total length of the SiC varied from 6.4 to 9.4 μm.

The length of the SiC blocks compared to the length of the transducer can be varied to give good coupling and minimum impedance. The simulation in FIG. 3 stores one wavelength (λ) in the SiC area under the transducer and one wavelength in the SiC-only area (i.e., one-half a wavelength on either side of the transducer). When the lengths of the two areas give the same frequency (these lengths will be different because of the different sound velocity obtained when AlN and Al are placed over SiC) the coupling will be optimized and the impedance of the resonator minimized. FIG. 5 shows a plot of the impedance Z as a function of frequency in GHz of the resonator shown in FIG. 3 with the total length of the SiC membrane varied from 6.4 to 9.4 μm and the transducer area constant at 3.75 μm. The graphs indicate the resonant frequencies for each of these membrane lengths. The resonant frequency decreases from about 3.2 GHz at 6.4 μm to about 2.55 GHz at 9.4 μm membrane length. The optimum range in terms of impedance is for a SiC length between 7.6 and 8.0 μm. In this range the impedance is relatively insensitive to SiC length. However, the 7.6 μm length also shows a significant parasitic mode at 2.87 GHz near the desired resonance at 2.93 GHz. Therefore, an 8.0 μm SiC length is preferable for this resonator configuration.

Figure 6:
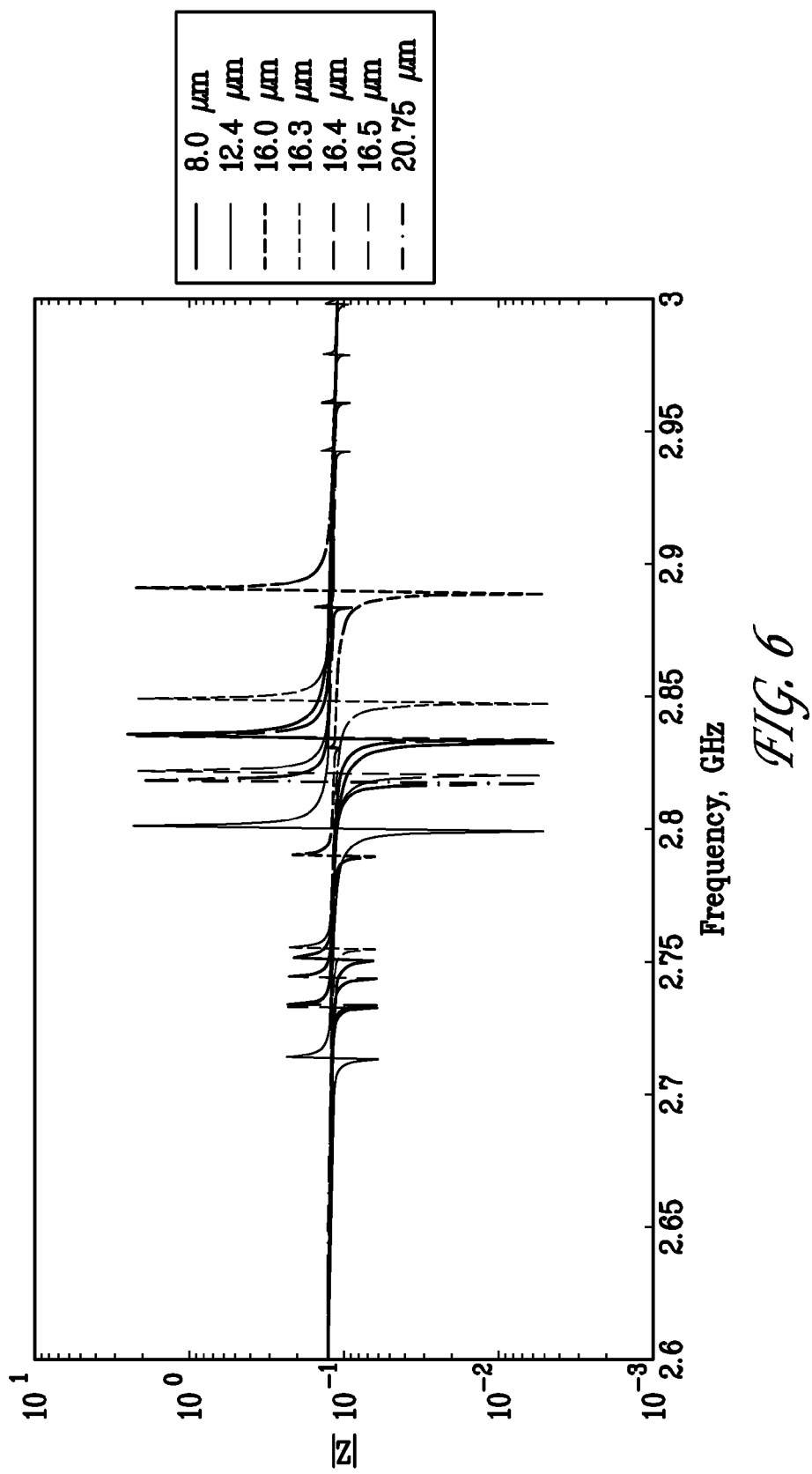
FIG. 6 is a graph of impedance versus frequency for the resonator for different SiC lengths.
Figure 7:
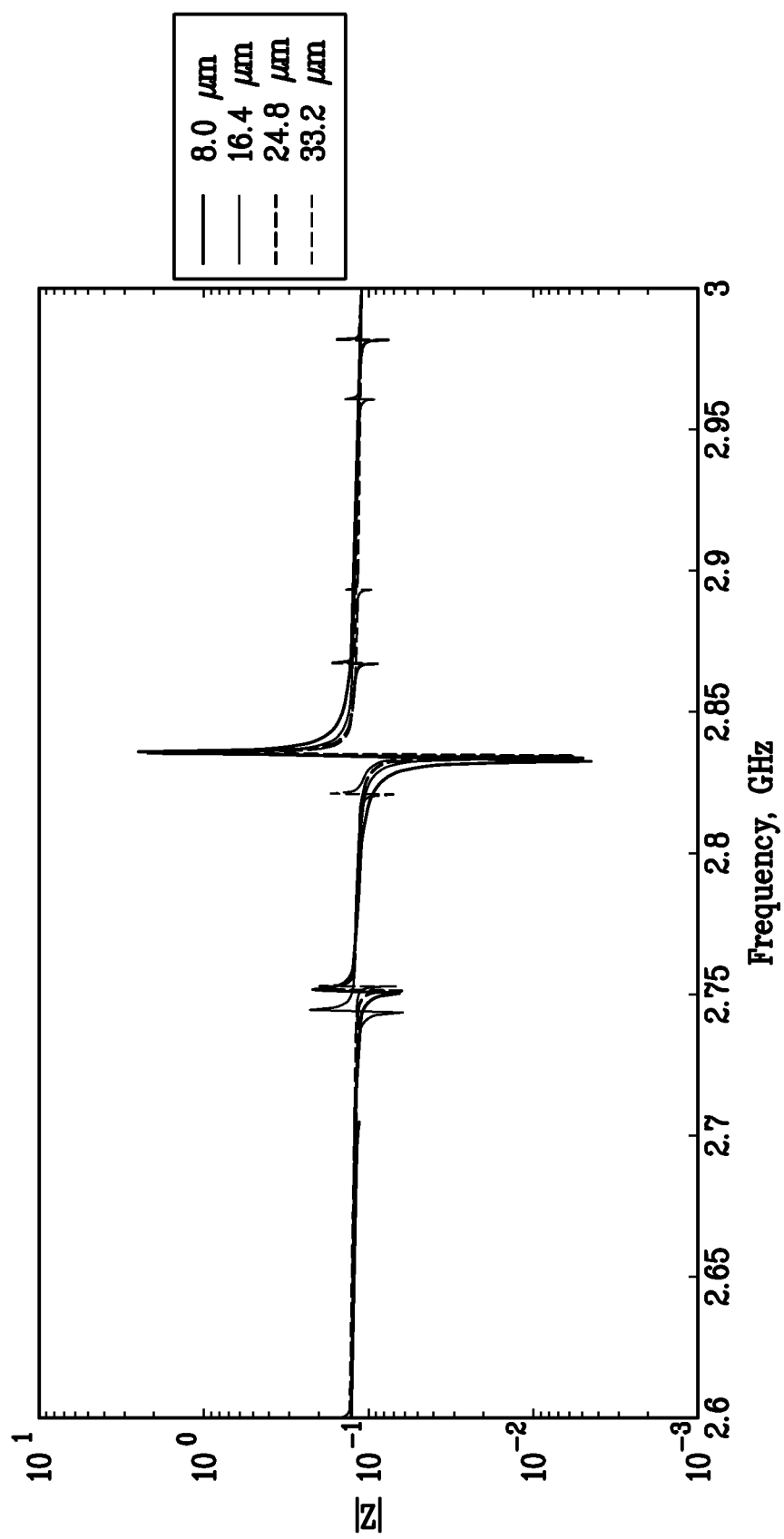
FIG. 7 is a graph of impedance versus frequency for the resonator for different SiC lengths corresponding to adding additional overtones.
Figure 8:
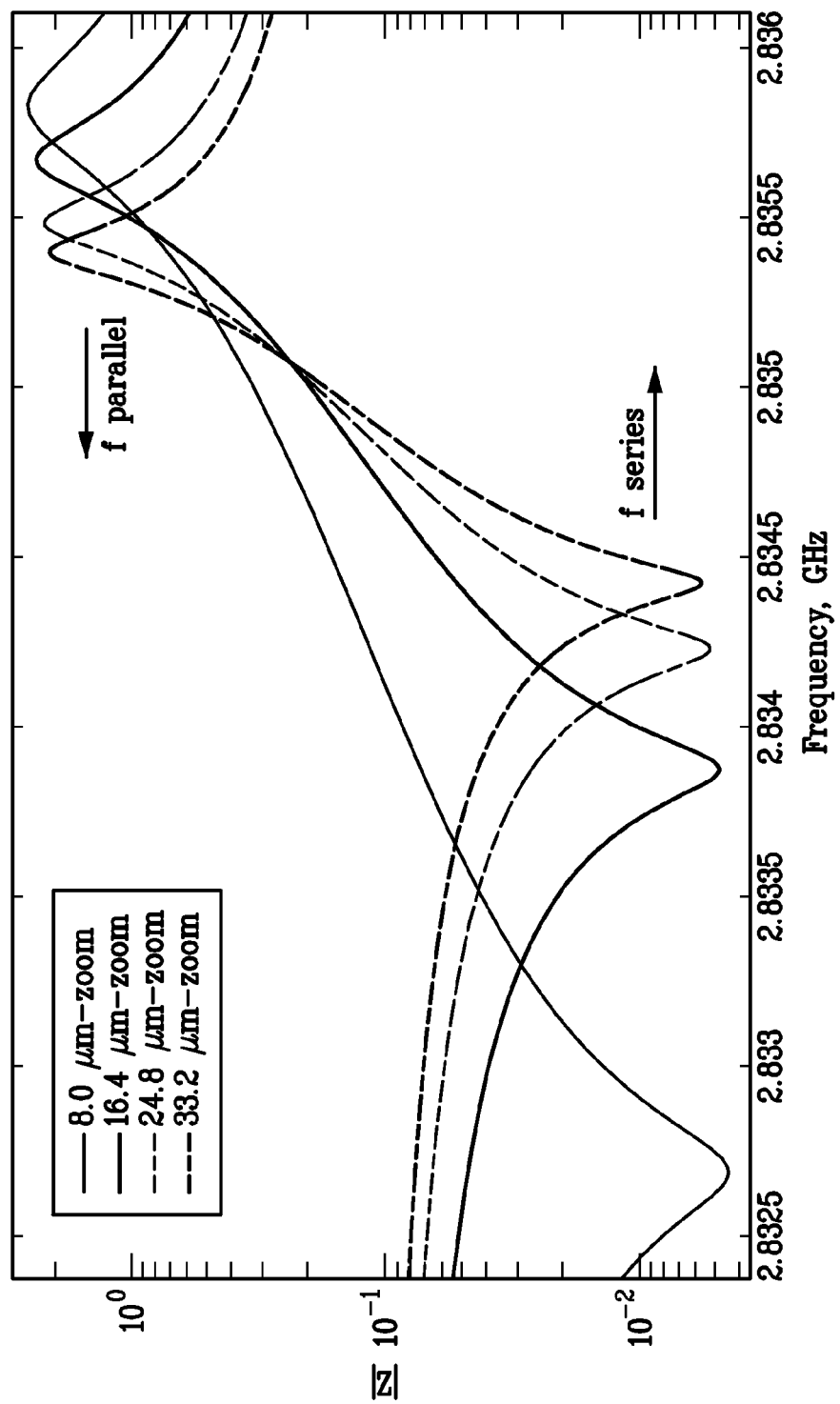
FIG. 8 is a zoom-in of the response in FIG. 7 showing increases in Q, and reductions in coupling coefficient, $k_t^2$, (measured by the separation between series and parallel resonances) when adding additional wavelengths of SiC.
Figure 9:
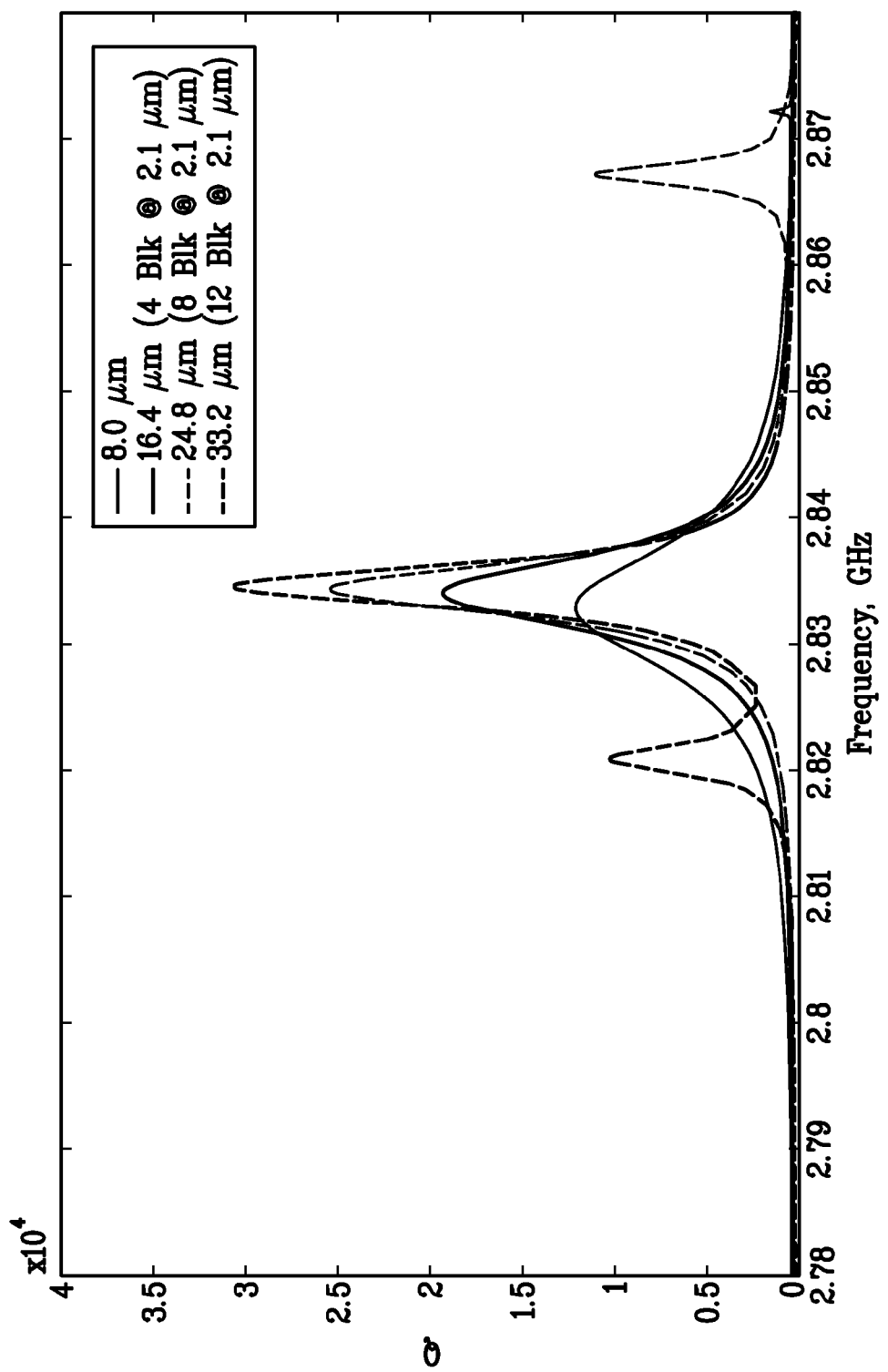
FIG. 9 is a graph of resonator Q with increasing SiC overtones.

Simulations can be used to determine if adding blocks of SiC will increase the Q of a lateral overmoded resonator without significantly reducing the impedance. FIG. 6 shows plots of the impedance Z as a function of frequency in GHz of the resonator simulation shown in FIG. 3 for different SiC membrane lengths varying from 8.0 μm to 20.75 μm. The plots show the resonant frequencies and the parasitic modes at slightly lower frequencies for each of these membrane lengths. For example, the 8.0 μm membrane length has a resonant frequency of about 2.83 GHz and a parasitic mode at about 2.75 GHz. To maintain constant frequency, while increasing Q through overtoning, SiC blocks of 4.2 μm, corresponding to a one-half wavelength in SiC, can be added to each side of a 8-μm long SiC resonator membrane. FIGS. 7, 8, and 9 investigate the Q and coupling coefficient as extra wavelengths of SiC are added to the overtone resonator simulation (indicated by the total SiC length). The material losses assumed in these simulations were $Q_{Al}$=1000, $Q_{AlN}$=6000, and $Q_{SiC}$=75,000. FIG. 7 shows plots of the impedance Z as a function of frequency in GHz of the resonator for different SiC lengths varying from 8.0 μm to 33.2 μm, corresponding to adding additional overtones. As expected, the resonant frequency remains nearly constant at about 2.83 GHz for each wavelength of length (i.e., 8.4 μm) added to the resonator membrane. FIG. 8 shows zoom-ins of the response in FIG. 7, showing increases in Q (as indicated by the reduction in bandwidth Δf of the series and parallel resonance peaks about the center resonant frequency f) and reductions in the coupling coefficient, $k_t^2$, (measured by the separation between series and parallel resonance peaks ($f_{series}$ and $f_{parallel}$) at the low and high frequency ends of the band, respectively) when adding additional wavelengths of SiC. FIG. 9 shows plots of the resonator Q (i.e., f/Δf) with increasing SiC overtones from FIG. 7 and FIG. 8 (e.g., in the caption of FIG. 9, "4 Blk @ 2.1 μm" indicates that four blocks of 2.1 μm length are added to the 8.0 μm resonator membrane to provide a total length of 16.4 μm in the simulation, "8 Blk @ 2.1 μm" indicates that eight blocks of 2.1 μm length are added to the 8.0 μm resonator membrane to provide a total length of 24.8 μm in the simulation, and "12 Blk @ 2.1 μm" indicates that twelve blocks of 2.1 μm length are added to the 8.0 μm resonator membrane to provide a total length of 33.2 μm in the simulation). As can be seen in these figures, particularly in FIG. 8, as additional blocks of SiC are added at the end of the resonator, the minimum and maximum impedances and the frequency remain nearly constant, the coupling coefficient decreases, and Q increases. Therefore, as shown in FIG. 9, the quality factor Q of the resonator can be increased to over 30,000 by adding SiC blocks (to approach the intrinsic Q of 75,000 of the SiC resonator material) without increasing the impedance or insertion loss of the resonator, as shown in FIG. 8. Further, additional AlN electrodes can be added to the resonator to reduce the impedance.

Since the density, sound velocity and modulus of SiC and AlN are roughly equal, the resonator Q can be approximated by $$Q_{resonator} = \left[ \frac{\frac{1}{Q_{SiC}} + \frac{l_{AlN}}{l_{SiC}Q_{AlN}}}{1 + \frac{l_{AlN}}{l_{SiC}}} \right]^{-1} \quad (1)$$

where l is the length of the of the AlN and SiC portions of the resonator, respectively. Using Eq. (1), the area of a 50Ω AlN microresonator (150×150 μm), $Q_{AlN}$=8000 at 3 GHz (from FIG. 2) and $Q_{SiC}$=200,000 at 3 GHz (from S. Chandorkar et al.), the size of a lateral resonator vs. resonator Q can be estimated as shown in Table 1. See Chandorkar et al., "Limits of quality factor in bulk-mode micromechanical resonators," *IEEE MEMS Conf.*, 74 (2008). While the standard lateral resonator can achieve very high-Q, ultra high-Q lateral resonators become prohibitively large.

Table 1. Q vs. resonator area for 50 ohm, 3 GHz lateral and phononic crystal resonators. M is the number of mirror pairs on each side of the cavity.

Higher performance resonators can be achieved by isolating and minimizing the impact of the lossy piezoelectric material. Therefore, an embodiment of the lateral acoustic wave resonator of the present invention sets up a Fabry-Perot cavity in a high-Q material using high reflectivity acoustic cavity mirrors. Significantly improved resonator performance can be achieved by using a very low loss cavity resonator material, such as SiC. Acoustic reflectors can be used to decouple the high-Q cavity from the lower-Q piezoelectric transducers. In particular, a lateral quasi-two dimensional high-Q phononic crystal resonator enables filter arrays of lithographically defined frequency and bandwidth microresonators.

Figure 10:
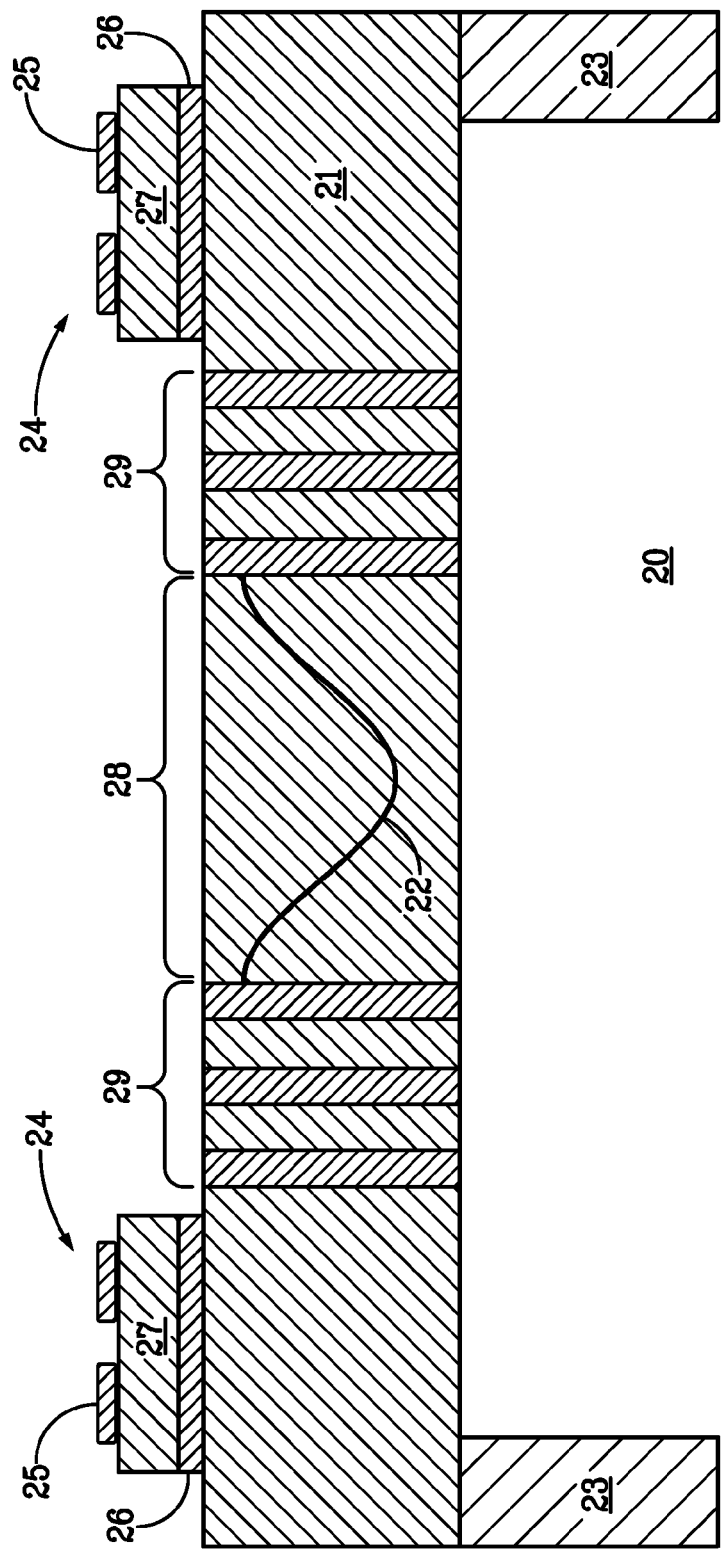
FIG. 10 is a cross-sectional side-view schematic illustration of a high-Q lateral acoustic wave resonator, where high-Q is achieved in a miniature acoustic Fabry-Perot cavity.

FIG. 10 shows is a cross-sectional side-view schematic illustration of a high-Q lateral acoustic resonator 20 of the present invention. The high-Q resonator 20 sets up a Fabry-Perot cavity 28 in a low-damping resonator material using high-reflectivity acoustic end mirrors 29. A thin membrane 21 of the low-damping resonator material can be suspended above an underlying substrate 23 to provide acoustic isolation of the cavity 28 from the substrate 23 and eliminate anchor losses. The cavity material is preferably a non-piezoelectric material which enables greater flexibility in terms of acoustic loss, temperature coefficient, and ease of fabrication. For example, the non-piezoelectric material can be silicon carbide (SiC), yttrium aluminum garnet (YAG), sapphire, or diamond. The cavity material can also be a piezoelectric material. The mirrors 29 preferably have a high reflectivity and large bandgap for longitudinal acoustic waves. Acoustic energy can be coupled into and out of the resonator cavity in the form of lateral acoustic waves 22 (i.e., elastic Lamb waves) through the high-reflectivity end mirrors (having some small transmittivity) or by using acoustic waveguides. Alternatively, acoustic waves can be coupled into the cavity optically, using optical waveguides or free space optics. The acoustic wave 22 can be generated and received by piezoelectric transducers 24. Each piezoelectric transducer 24 can comprise an IDT 25, comprising a fingerlike periodic pattern of parallel in-plane electrodes, on the surface of a piezoelectric material layer 27, and a bottom electrode 26 on the surface of the membrane 21. For example, the piezoelectric material can be aluminum nitride (AlN), lead zirconate titanate (PZT), lithium niobate ($LiBNO_3$), zinc oxide (ZnO), or barium strontium titanate (BST). The IDT 25 can selectively transduce a fundamental or an overtone mode defined by the electrode location, finger width, and finger spacing. Constructive interference occurs when the acoustic waves 22 reflected between the mirrors 29 are in-phase, thereby forming a standing wave resonance in the cavity 28. The resonator center frequency is determined by the speed of sound in the resonator material, the overtone mode of the cavity wave, and the cavity length. The piezoelectric transducers 24 reside outside of the cavity 28. Therefore, the acoustic mirrors 29 provide decoupling of the lower-Q piezoelectric transduction material from the higher-Q cavity material, thereby minimizing cavity damping and enabling a higher ultimate Q in a smaller footprint.

|  | Type | | | |
| --- | --- | --- | --- | --- |
|  | $Q = 5 \times 10^4$ | $Q = 1 \times 10^5$ | $Q = 1.5 \times 10^5$ | $Q = 2 \times 10^5$ |
| Lateral | 150 × 1200 μm² | 150 × 3600 μm² | 150 × 10800 μm² | Not practical |
| Phononic Crystal | 150 × 186 μm² <br> M = 4 | 150 × 1200 μm² <br> M = 5 | 150 × 1200 μm² <br> M = 6 | 150 × 1200 μm² <br> M = 7 |

An embodiment of present invention uses overtone operation inside the Fabry-Perot cavity to achieve an ultra high-Q acoustic wave resonator. Such an overmoded cavity resonator can achieve even higher Q than an overmoded lateral resonator in a fraction of the size. For example, a phononic crystal resonator reduces size by 100× compared to a standard lateral resonator, as shown in Table 1.

Figure 11:
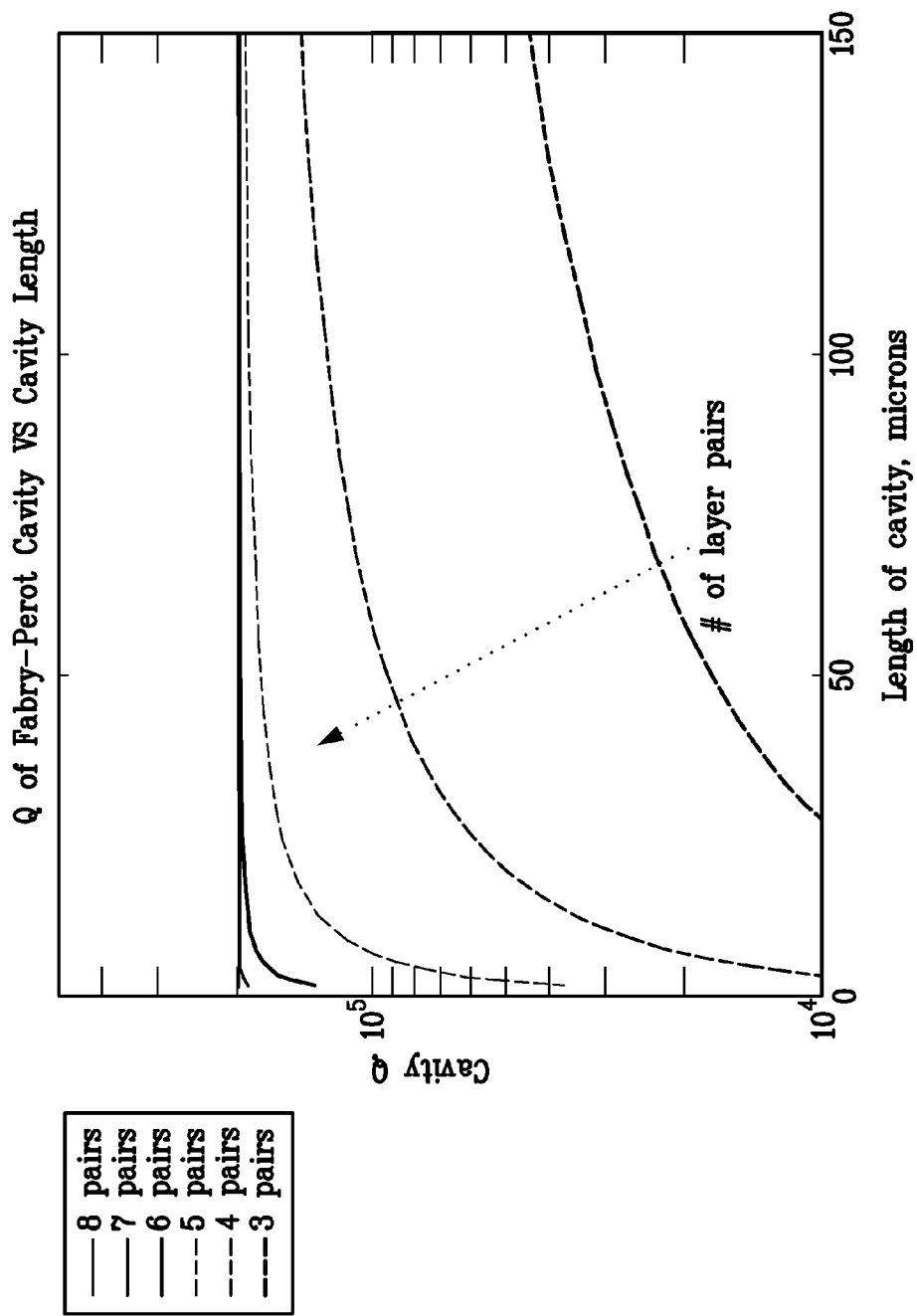
FIG. 11 is a graph of Q vs cavity length and number of 1D Bragg mirror layers of a 3 GHz Fabry-Perot cavity with an impedance mismatch of the mirror materials of 3.

The acoustic reflectors 29 can comprise 1D Bragg mirrors (i.e., a stack of quarter wavelength layers of materials with alternate high and low acoustic impedance), or 2D or 3D phononic crystals. FIG. 11 shows a graph of the Fabry-Perot cavity length and number of acoustic mirror pairs (i.e., 3 to 8 acoustic mirror pairs) needed to achieve a desired cavity Q at 3 GHz, where each acoustic mirror pair is formed by two 1D quarter wavelength layers, with an acoustic impedance mismatch of 3. 1D Bragg mirrors can be formed using, for example, $SiO_2$ (Z=12 MΩ) and SiC (Z=38 MΩ). See R. Aigner. With each acoustic mirror pair having a length of approximately 2 µm, very high Q cavities can be achieved in an extremely small size, which results in tremendous area reductions when compared to a lateral microresonator approach. As can be seen from FIG. 11, a Q of $2\times10^5$ can be obtained at a cavity length of 50 microns with only 6 mirror pairs. Low loss acoustic mirrors can be used so that damping in the mirror layers does not degrade the cavity Q.

A phononic crystal mirror can have very low damping. Phononic crystals are formed by the periodic arrangement of scattering centers in a host matrix with a high acoustic impedance mismatch between the scattering centers and the host matrix. See R. H. Olsson III and I. El-Kady, *Measurement Science and Technology* 20, 012002 (2009), which is incorporated herein by reference. Solid-solid phononic crystals exhibit wide band gaps and have relatively large minimum feature sizes. Phononic crystals have been fabricated at frequencies as high as 1 GHz, using high acoustic impedance scattering inclusions, such as tungsten, in a low acoustic impedance background matrix, such as silicon dioxide, and have been shown to block phonon propagation through a synthetic material over a wide frequency range. See U.S. patent application Ser. Nos. 11/748,832 and 12/764,700 to Olsson et al., which are incorporated herein by reference.

Figure 12:
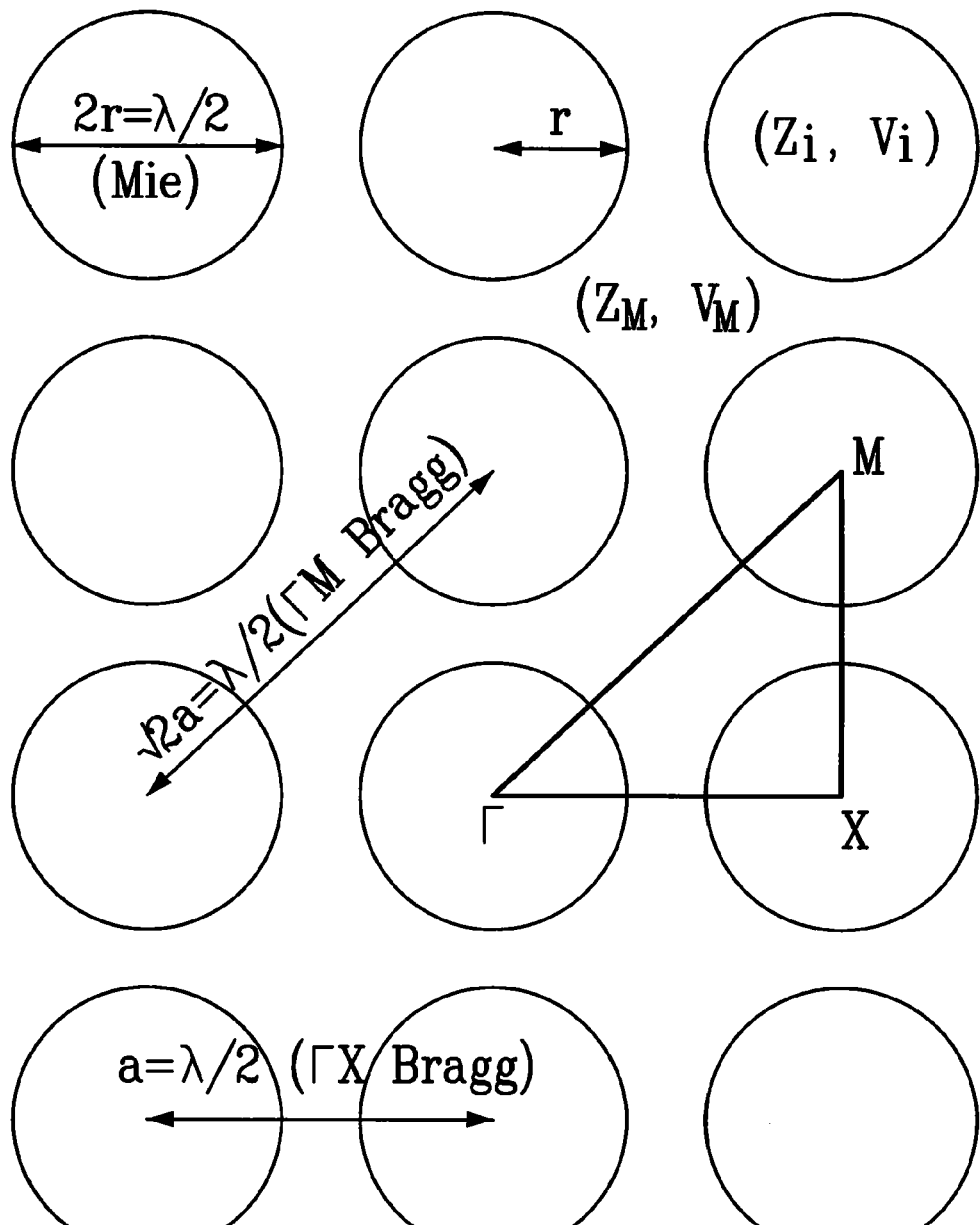
FIG. 12 is a schematic diagram of a 2D square lattice periodic phononic crystal.

Alternatively, air-solid phononic crystals, comprising cylindrical air holes in a solid host matrix, can also be used. Therefore, high reflectivity, low loss 2D phononic crystal mirrors comprising air holes in a high-Q material layer (e.g., SiC) can be used to set up the Fabry-Perot cavity. A diagram of a square lattice (or simple cubic) phononic crystal is shown in FIG. 12, where the acoustic reflectivity of the crystal is dependent on the material properties, modulus and sound velocity, as well as the dimensional parameters, r and a, where r is the radius of the vacuum inclusions and a is the spacing or lattice constant of the vacuum inclusions in the SiC host medium.

Figure 13:
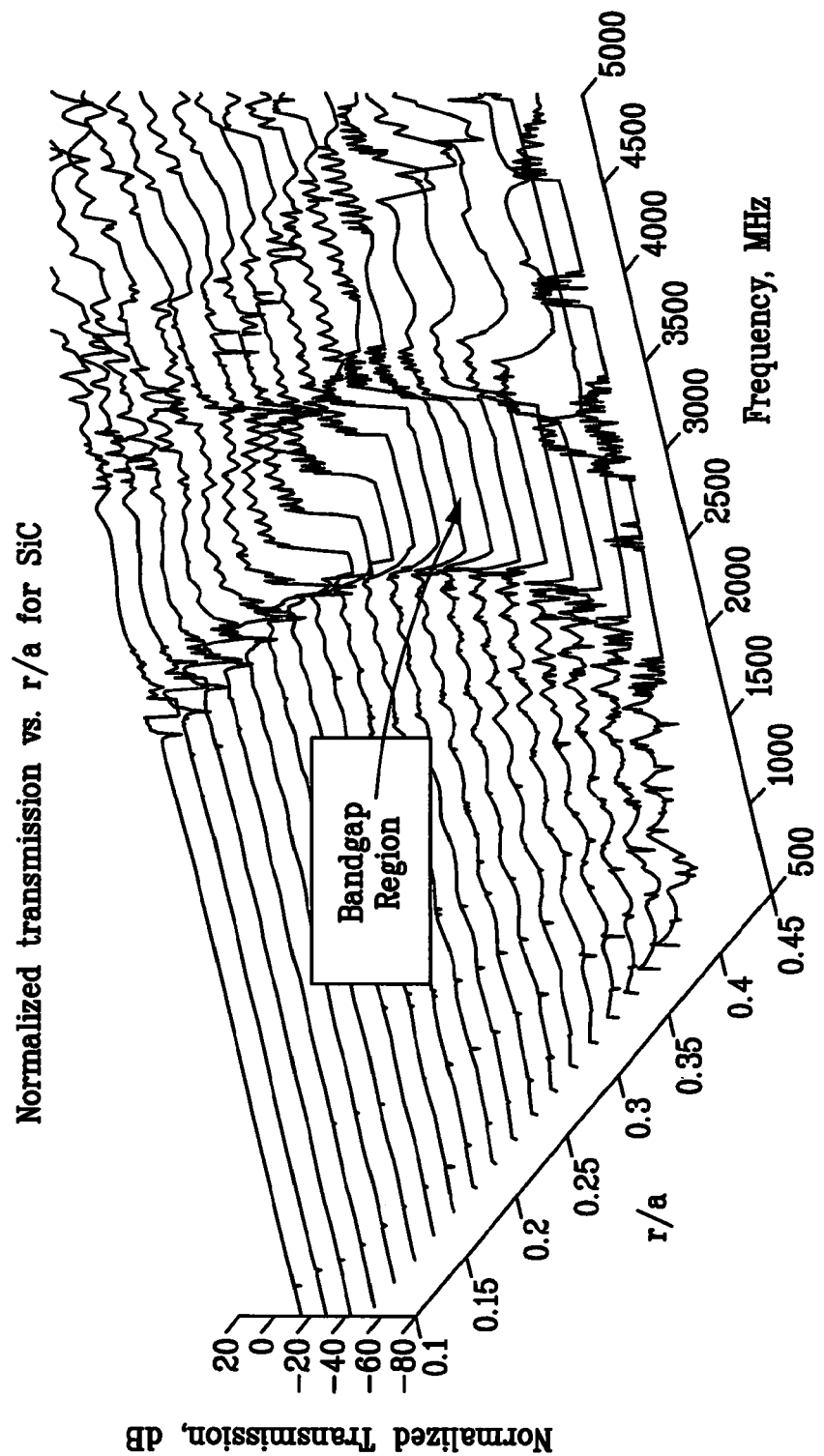

FDTD modeling can be used to find the optimum r/a ratio for vacuum/SiC phononic crystals. FIG. 13 shows the normalized (to the transmission through SiC without a phononic crystal) transmission in dB for longitudinal acoustic waves vs. frequency in MHz for a 7 period, simple cubic lattice of vacuum inclusions embedded in an infinitely thick SiC plate vs. inclusion filling fraction, r/a. In this figure, a=1.83 µm, a filling fraction of r/a ~0.35 centers the bandgap region at approximately 3 GHz. Further, the bandgap width at this filling fraction is almost 1 GHz. As the filling fraction, r/a, is increased, the bandgap, which is taken as the maximum of the normalized transmission for the ΓX and ΓM directions, increases in width and depth while moving to lower frequencies.

Figure 14:
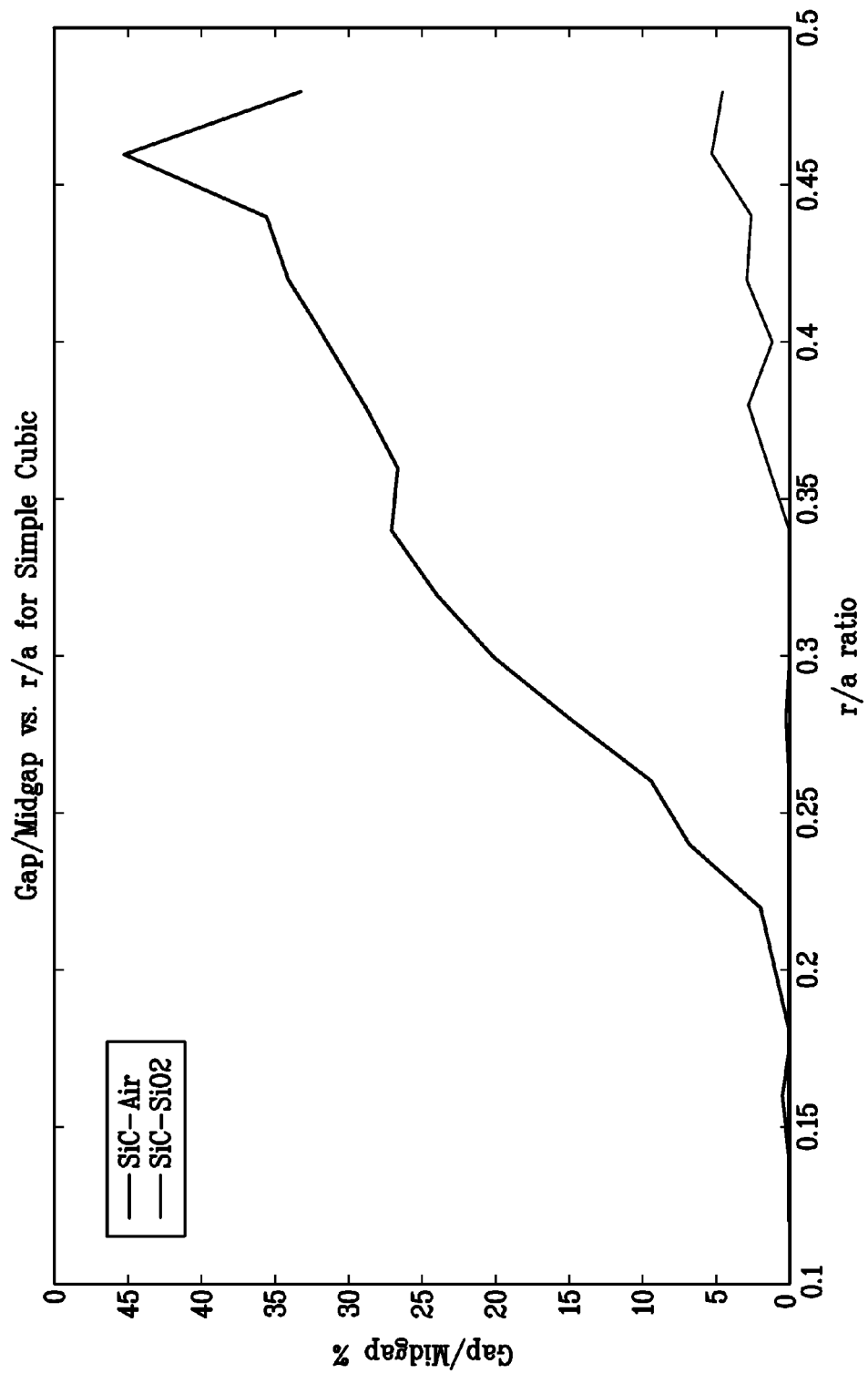
FIG. 14 is a graph of bandgap width for longitudinal acoustic waves, in %, vs. r/a ratio for the simple cubic SiC/vacuum lattice.

The bandgap width for longitudinal acoustic waves, in % of the frequency width of the gap divided by the midgap frequency, vs. r/a ratio for the 7-period simple cubic SiC/vacuum or air lattice is shown as the heavy curve in FIG. 14. Also shown as the lighter curve in this figure is the bandgap width for longitudinal acoustic waves in a 7-period simple cubic lattice of $SiO_2$ inclusions in a SiC host medium. As can be seen, the gap/midgap % performance of the SiC/vacuum phononic crystal is vastly superior to that of the SiC/$SiO_2$ phononic crystal. As expected from FIG. 13, the bandgap width of the SiC/vacuum phononic crystal, which is a strong indicator of the reflectivity, increases with increasing r/a ratio.

Figure 15:
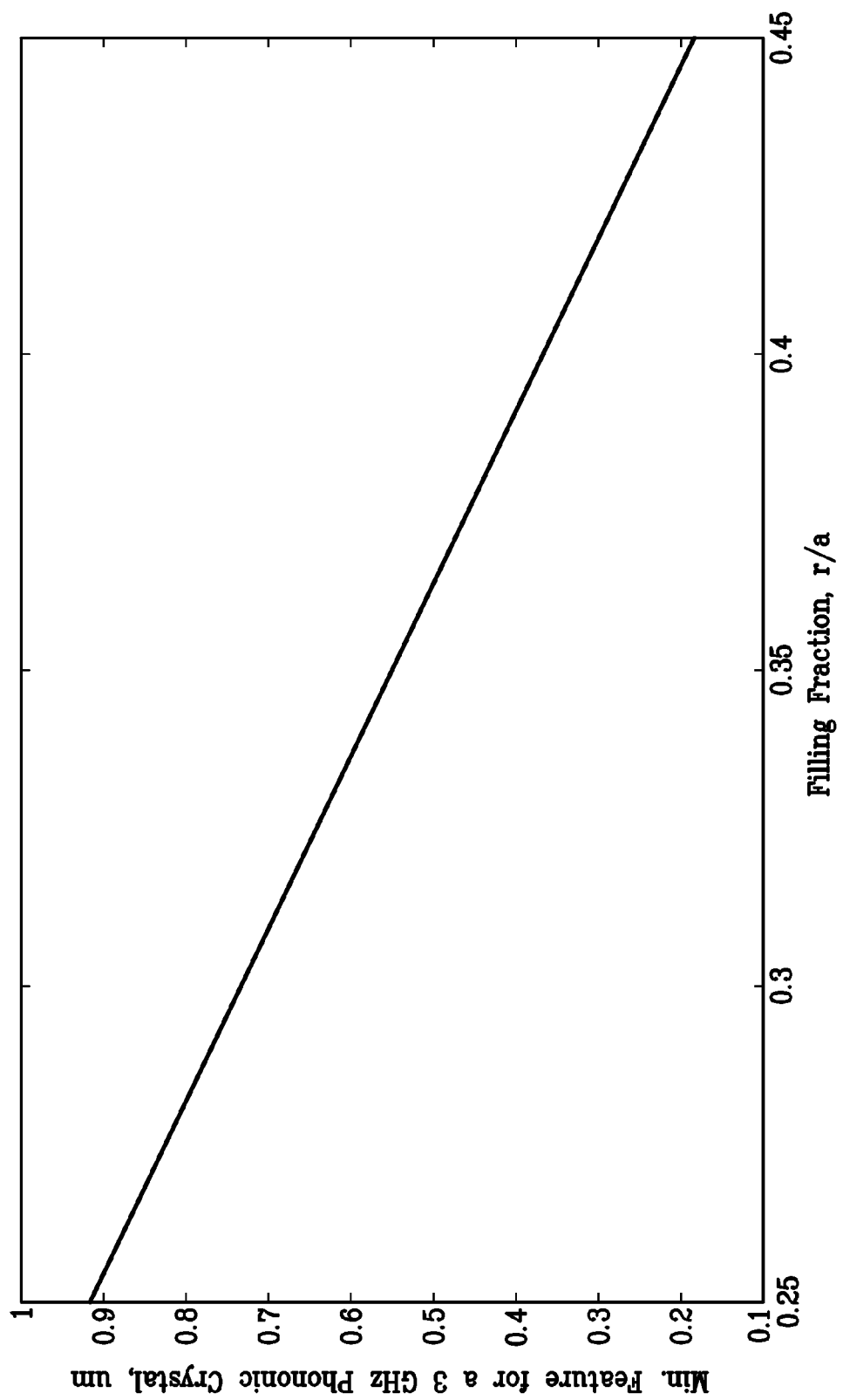
FIG. 15 is a graph of minimum lithography feature vs. filling faction for a 3 GHz SiC/vacuum phononic crystal with a lattice constant of 1.83 μm.

FIG. 15 shows the minimum lithography feature vs. filling faction, r/a, for a 7-period, 3 GHz SiC/vacuum phononic crystal with a lattice constant of 1.83 µm. As can be seen in FIGS. 14 and 15, as the bandgap width increases with r/a, so do the lithography requirements because the vacuum inclusions are coming closer together, touching at r/a=0.5. Operation at r/a=0.35 results in a high gap-to-midgap ratio of >25% and a high reflectivity for longitudinal acoustic waves, a gap-to-midgap ratio that is insensitive to process induced variations in the filling fraction, and a modest minimum feature size >0.5 µm.

For 3 GHz phononic crystals, the crystal thickness and lattice constant can be on the same order of magnitude. Therefore, the crystal thickness plays an important role in opening a phononic bandgap and on the properties, primarily bandwidth and acoustic reflectivity, of the phononic crystal. Vacuum/SiC phononic crystal properties can be simulated using FDTD as a function of r/a ratio, and each r/a case can be modeled at various SiC film thicknesses, t, to optimize, as much as possible, the performance of the phononic crystals that form the cavities.

Figure 16:
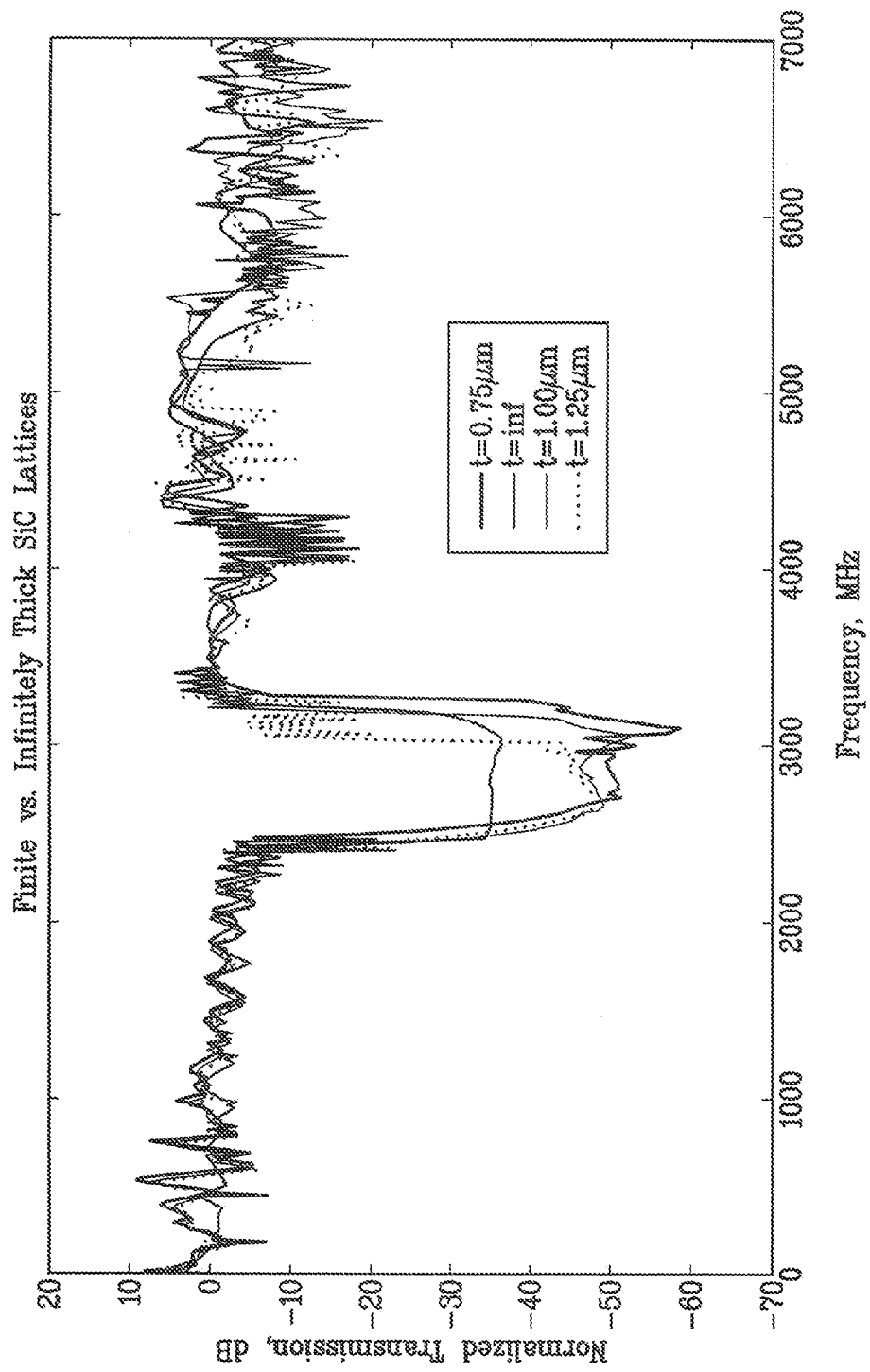
FIG. 16 is a graph of normalized transmission for longitudinal acoustic waves in a 2D simple cubic lattice SiC/vacuum phononic crystal vs. crystal thickness. The lattice constant a=1.83 μm, and the filling fraction r/a=0.35.

FIG. 16 is a plot of normalized transmission in dB for longitudinal acoustic waves in a 2D, 7-period, simple cubic lattice SiC/vacuum phononic crystals vs. frequency in MHz as a function of crystal thickness t for finite thicknesses of t=0.75 µm, t=1.00 µm, and t=1.25 µm and for an infinitely thick SiC lattice (t=inf). The lattice constant, a=1.83 µm, and the filling fraction, r/a=0.35. As can be seen in the figure, the frequency bandgap narrows and becomes less reflective (i.e., more transmissive) when the thickness exceeds 1 µm and becomes unusable for thicknesses exceeding 1.25 µm or 0.7 a. For a thickness of 1 µm, the width of the bandgap is identical to that of the infinitely thick case. The bandgap width and depth are optimized for a thickness of t=0.75 µm.

Figure 17:
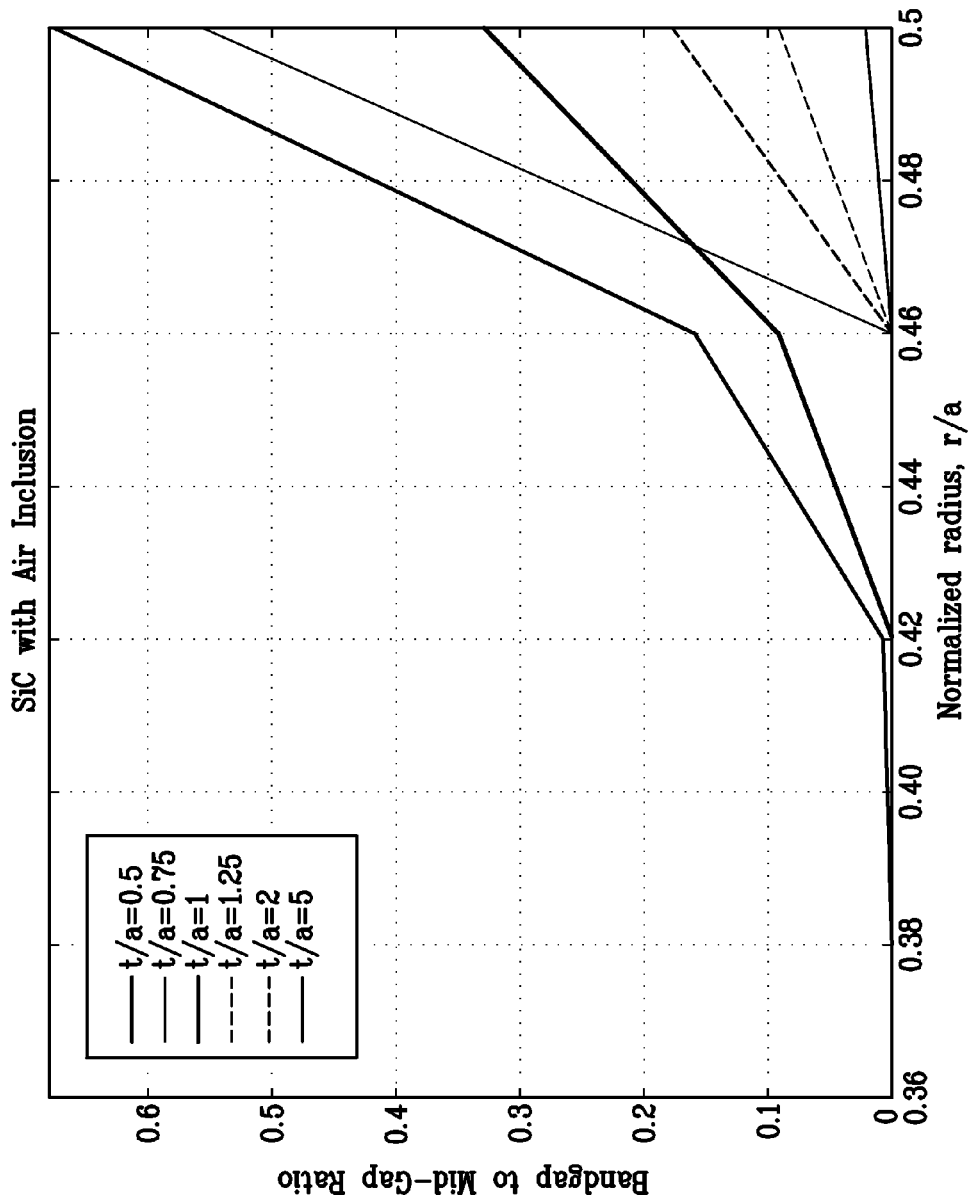

FIG. 17 is a graph of the bandgap width to mid-gap ratio for all acoustic waves (longitudinal, transverse, and flexural) in % vs. normalized radius r/a for a simple cubic SiC/vacuum or air lattice (i.e., SiC plate with air inclusions) with different normalized thicknesses, t/a, of 0.5, 0.75, 1, 1.25, 2, and 5. As suggested by FIGS. 13-16, the bandgap narrows (i.e., the bandgap to mid-gap decreases) for small filling fractions, r/a, and at large thicknesses, t/a.

Figure 18:
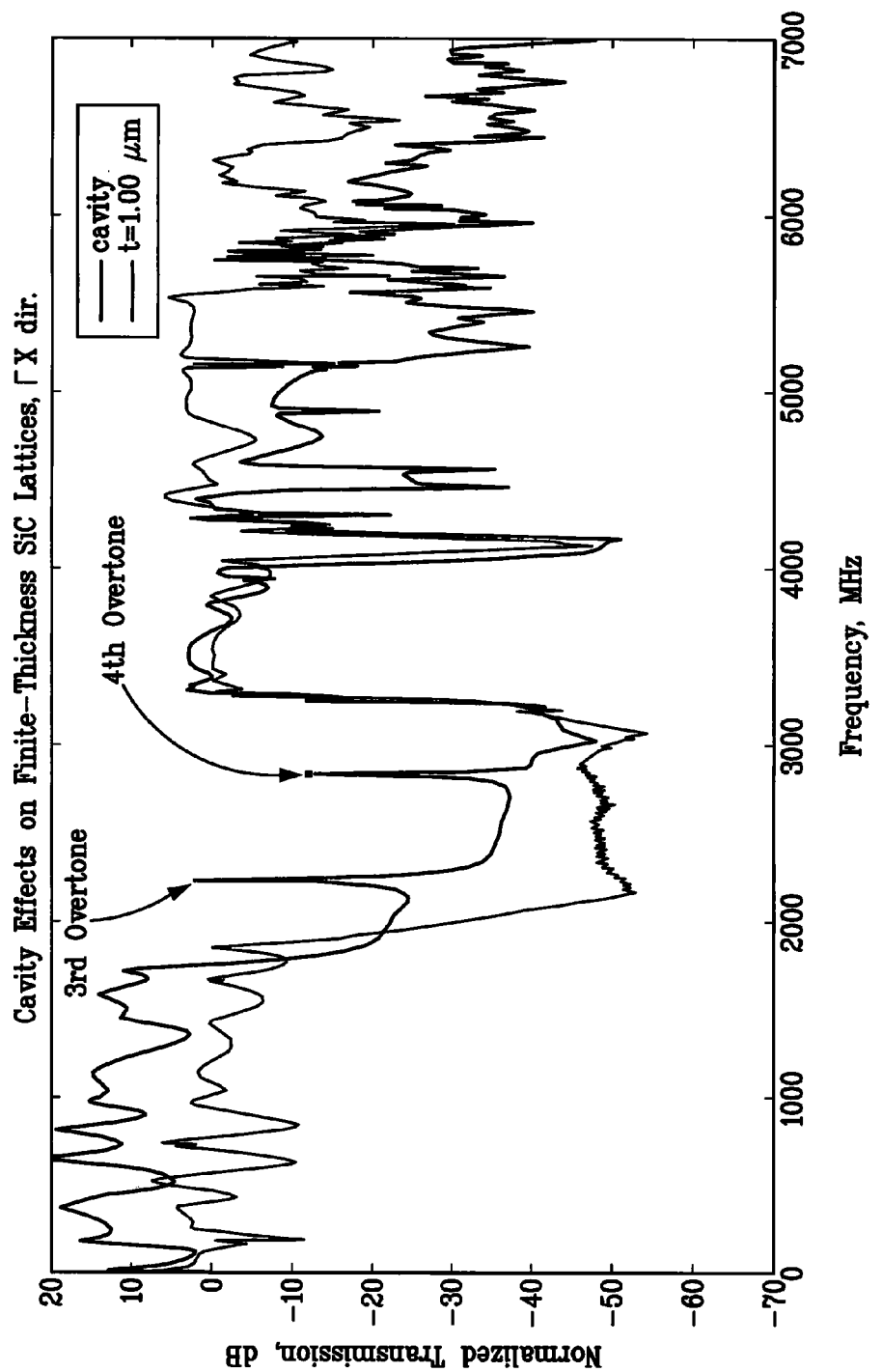
FIG. 18 is a graph of normalized transmission for longitudinal acoustic waves in a 7-period simple cubic lattice phononic crystal of vacuum inclusions in a 1-μm thick SiC plate with a=1.83 μm and r/a=0.35.

FIG. 18 shows a plot of the normalized transmission in dB vs. frequency in MHz for longitudinal acoustic waves (i.e., in the ΓX direction) in a 7-period simple cubic lattice phononic crystal of vacuum inclusions in a t=1-µm thick SiC plate with a lattice constant a=1.83 µm, and r/a=0.35 (labeled "t=1.00 µm"). Consistent with FIG. 16, the bandgap is quite wide and deep for a 7-period phononic crystal in a thin plate. FIG. 18 also shows a plot of the normalized transmission of longitudinal acoustic waves in an 8-µm wide phononic crystal cavity placed between identical, 3-period SiC/vacuum phononic crystal plates with a=1.83 µm and r/a=0.35 (labeled "cavity"). As is evident from FIG. 11, the 3-period cavity has a relatively low Q. Both the 3$^{rd}$ and 4$^{th}$ overtones of the cavity appear in the bandgap region due to the lower Q of the cavity.

Figure 19:
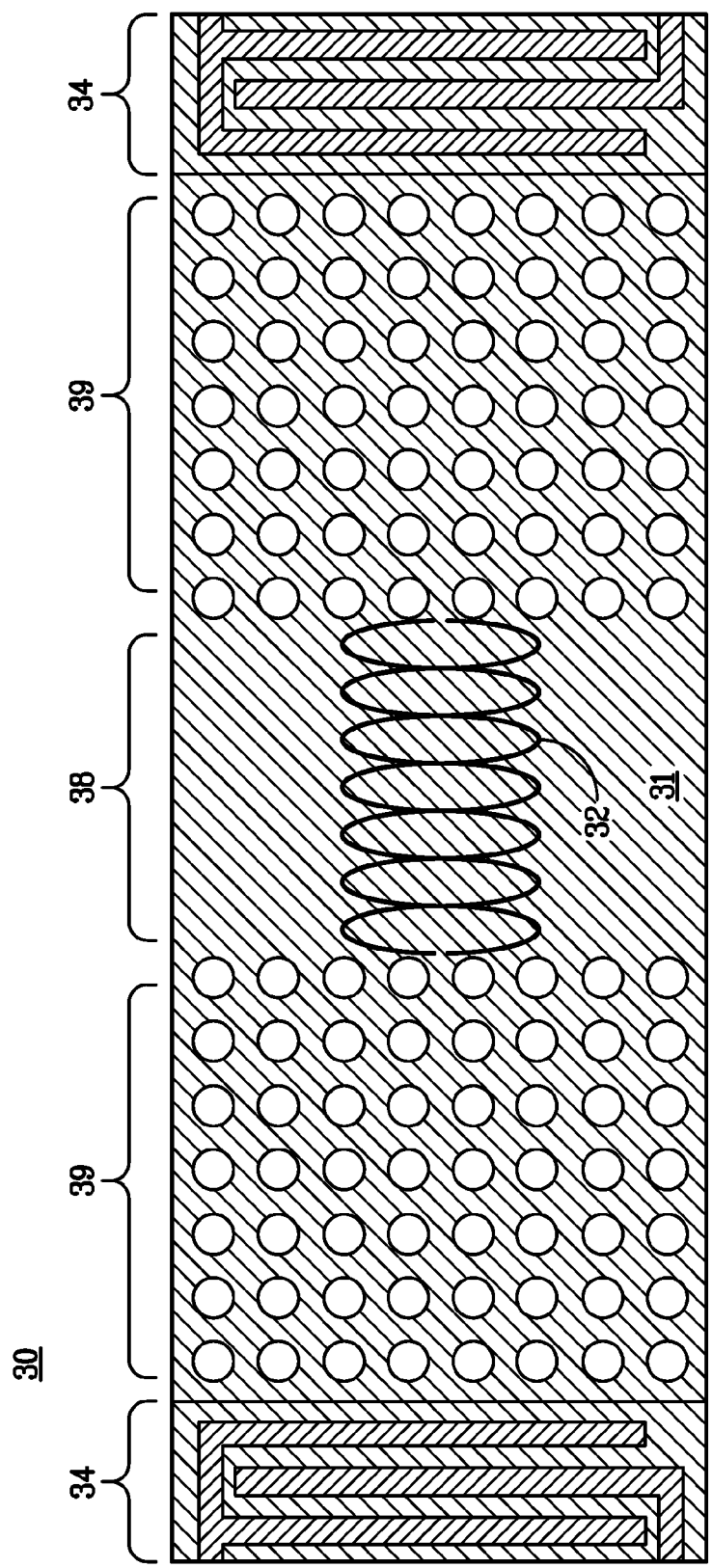
FIG. 19 is a top-view schematic illustration of an ultra high-Q phononic crystal resonator that traps an acoustic overtone wave in a Fabry-Perot cavity with phononic crystal end mirrors.

FIG. 19 shows a top-view schematic illustration of an ultra high-Q phononic crystal resonator 30 that traps a 7$^{th}$ overtone wave 32 in a Fabry-Perot cavity 38 with phononic crystal end mirrors 39. For example, high-Q lithographically defined 3 GHz phononic crystal resonators can be fabricated in a small size on a single wafer utilizing CMOS compatible materials and processes. To achieve a 50Ω resonator with a Q of 200,000, dimensions of the resonator can be about 150 μm wide by 190 μm long. The length is broken down as 150 μm for the piezoelectric transducers 34, 28 μm for the phononic crystal mirrors 39, and 12 μm between the mirrors forming a 7$^{th}$ overtone cavity 38 on a SiC membrane 31.

Figure 20A:
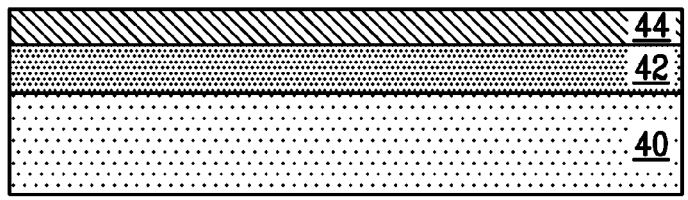
FIGS. 20A to 20I show a schematic illustration of an exemplary fabrication method for a high-Q phononic crystal resonator.
Figure 20B:
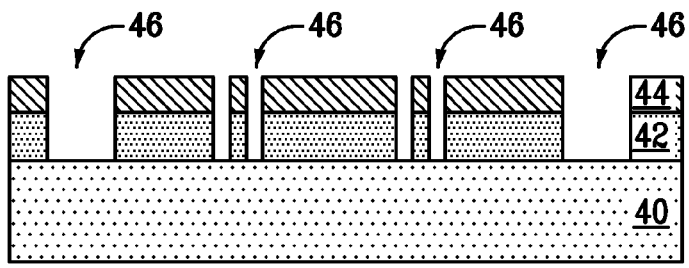
Figure 20C:
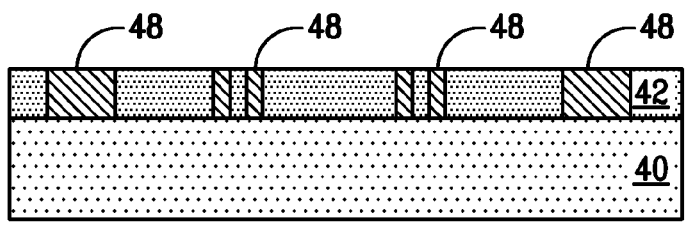
Figure 20D:
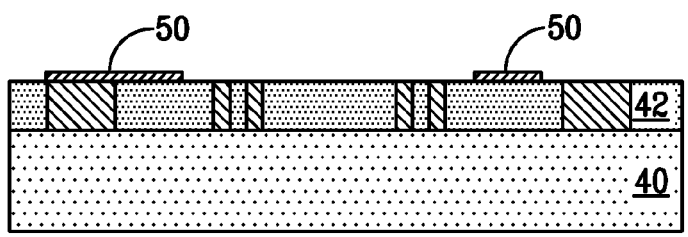
Figure 20E:
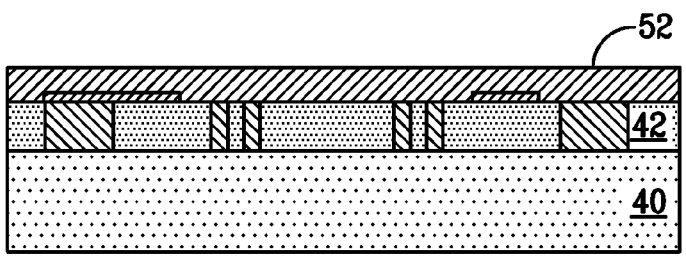
Figure 20F:
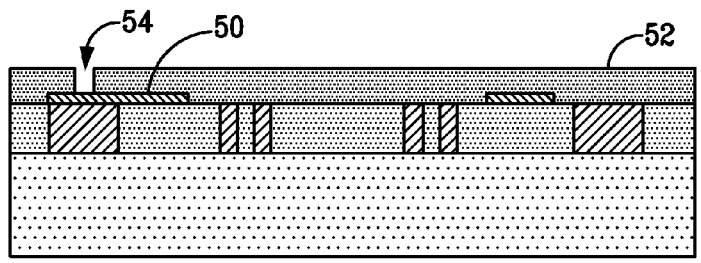
Figure 20G:
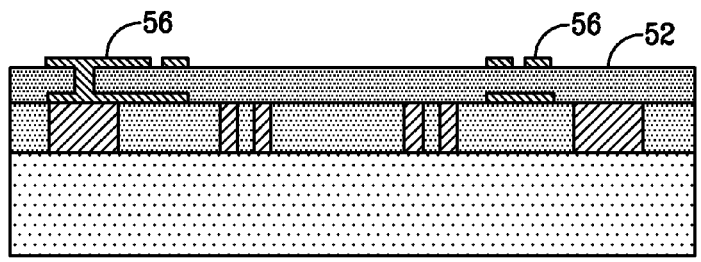
Figure 20H:
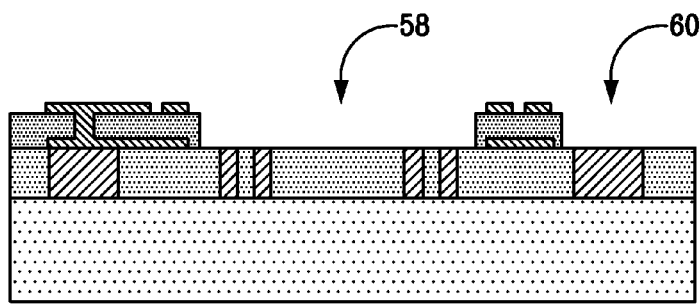
Figure 20I:
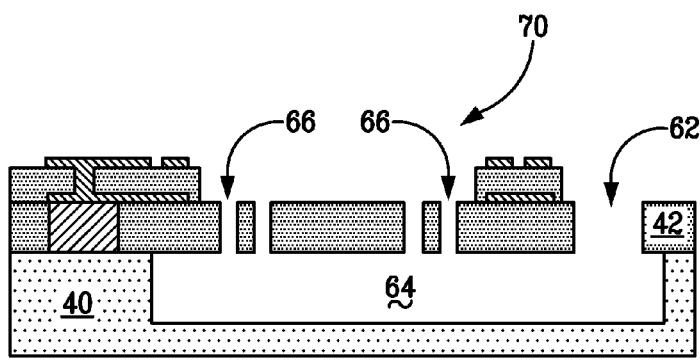

The lateral acoustic wave resonator can be fabricated using conventional surface micromachining and CMOS processes and built up layer by layer from a plurality of deposited and patterned material layers. FIG. 20 is a schematic illustration of an exemplary method to fabricate a high-Q phononic crystal resonator with overtone operation within a Fabry-Perot cavity. In FIG. 20A, a 1-μm thick SiC resonator material layer 42 can be blanket deposited on a Si substrate 40 by low-pressure chemical vapor deposition (LPCVD). An oxide layer 44 can be deposited on the SiC layer 42 that will serve as a hard mask for subsequent SiC etching. In FIG. 20B, the oxide layer 44 can be patterned by reactive ion etching using a photolithographically-defined etch mask and the SiC film 42 can be etched to form openings 46 that will provide the air hole inclusions in the SiC/air phononic crystal array along with what will be electrical contact plugs and release openings. In FIG. 20C, a tungsten sacrificial material 48 can be deposited by chemical vapor deposition (CVD) and planarized via chemical-mechanical-polishing (CMP) until it remains only where the SiC was etched. This fabrication approach enables the SiC etch to be performed as the first process step when the wafers are flat and have no topography. This is beneficial since the 0.5 μm space between phononic crystal air holes 66 is the tightest lithography feature in resonator and because the selectivity of masks to SiC etching is generally poor. The tungsten fill of the openings allows the process to continue on planar wafers. In FIG. 20D, a Ti/TiN/Al (20/50/50 nm) bottom electrode 50 for the piezoelectric resonator transducer can be deposited on the planarized layer and patterned. In FIG. 20E, a 200-nm thick AlN layer 52 can be sputter deposited on the bottom electrode and the planarized SiC layer. In FIG. 20F, openings 54 for electrical contacts to the bottom electrode 50 can be etched through the AlN layer 52 stopping on the bottom electrodes. In FIG. 20G, a 100-nm thick top electrode Al layer 56 can be sputtered onto the AlN layer 52 and patterned. The top electrode can be an IDT electrode that is patterned to selectively transduce an overtone defined by the electrode location, finger width, and finger spacing. In FIG. 20H, AlN can be removed from the above the phononic crystal and overtone resonator cavity areas 58 as well as the release opening areas 60 where tungsten is exposed. In FIG. 20I, the exposed tungsten 62 and 66 and a portion of the underlying silicon substrate 64 are removed and the suspended resonator 70 is released in an isotropic, dry XeF$_2$ etch. The final fabrication process comprises five mask levels. All of the materials are post-CMOS compatible and can be deposited and etched suing standard CMOS tools.

Batch fabrication and the ability to place arrays of resonators onto a single chip for use as filters is appealing for a number of high volume RF transceiver applications. When used in a filter array, a significant challenge is achieving a level of frequency control that allows lithographically defined, narrow channel spacings. For example, a filter array with a 30 kHz spacing enables 10 ppm frequency control. This represents a factor of 50 improvement in current state-of-the-art microresonator technology. See G. K. Ho et al., "Process Compensated Micromechanical Resonators," *IEEE MEMS Conf.*, 183 (2007). The resonant frequencies of the cavities in FIG. 10 are equal to $$f = \frac{nc}{2l} \quad (2)$$

where c is the speed of sound (11.9 km/s in SiC), l is the length of the cavity and n is the overtone. Achieving lithographically defined 30 kHz channel spacings in a filter array based solely on cavity length requires increasing the distance between the acoustic end mirrors. For a fundamental, n=1, cavity at 3 GHz the length l is 1.98 μm. To change the resonant frequency of a fundamental mode cavity by 30 kHz, the cavity length must be changed by 19.8 μm. Such dimensional control is not currently possible. The length of a 3 GHz cavity operating in its 500$^{th}$ overtone is 992 μm. To change the resonant frequency of this overtone mode cavity by 30 kHz, the length can be varied by a much more reasonable 10 nm. The ability to match line features in a large field to within 10 nm is within the capabilities of modern optical lithographic steppers.

The resonator size can be further reduced using an edge bias compensation technique. With this technique, cavity width can be varied to compensate for systematic variation in cavity length to fine tune the frequency control. Since the speed of sound in the cavity is slightly dependant on cavity width, lithographic induced variation in cavity width can be used to change the resonant frequency of the cavity. For example, the length and width of the cavity of the resonator in FIG. 10 can be defined using the same lithographic and etching steps. A negative edge bias (a line smaller than that drawn in a CAD tool due to lithography and etching variations) will result in a shorter cavity and an increase in resonant frequency by slowing the speed of sound in the cavity. The same edge bias results in a narrower cavity width which leads to a lower resonant frequency. For certain cavity length/width combinations, the two edge bias effects cancel resulting in a resonator whose frequency is less sensitive to lithographic variation. See U.S. Pat. Nos. 7,616,077 and 7,652,547 to Jonathan W. Wittwer and Roy H. Olsson, both of which are incorporated herein by reference.

The present invention has been described as a high-Q lateral acoustic wave resonator. It will be understood that the above description is merely illustrative of the applications of the principles of the present invention, the scope of which is to be determined by the claims viewed in light of the specification. Other variants and modifications of the invention will be apparent to those of skill in the art.

We claim:
1. A lateral acoustic wave resonator, comprising:
a planar membrane, comprising a low damping resonator material, suspended from a substrate; and
a piezoelectric transducer disposed on the membrane and adapted to generate a fundamental or overtone mode lateral acoustic wave and thereby form a standing wave resonance in the membrane,
wherein the resonator material comprises a non-piezoelectric material comprising silicon carbide, sapphire, yttrium aluminum garnet, or diamond.

2. A lateral acoustic wave resonator, comprising:
a planar membrane, comprising a low damping resonator material, suspended from a substrate;
a piezoelectric transducer disposed on the membrane and adapted to generate a fundamental or overtone mode lateral acoustic wave and thereby form a standing wave resonance in the membrane, wherein the resonator material comprises a piezoelectric material; and
a Fabry-Perot cavity, comprising two opposing acoustic reflector end mirrors, in the membrane and wherein the piezoelectric transducer resides outside of the cavity and wherein the standing wave resonance is formed in the cavity.

3. The resonator of claim 1 or 2, wherein the resonator has a quality factor greater than $5 \times 10^4$.

4. The resonator of claim 1 or 2, wherein the standing wave resonance has a resonant frequency between 100 MHz and 100 GHz.

5. The resonator of claim 4, wherein the standing wave resonance has a resonant frequency between 1 GHz and 10 GHz.

6. The resonator of claim 1 or 2, wherein the membrane is less than one acoustic wavelength in thickness.

7. The resonator of claim 1 or 2, wherein the substrate comprises silicon.

8. The resonator of claim 1 or 2, wherein the substrate comprises silicon carbide or quartz.

9. The resonator of claim 1 or 2, wherein the piezoelectric transducer comprises aluminum nitride.

10. The resonator of claim 1 or 2, wherein the piezoelectric transducer comprises lead zirconate titanate, lithium niobate, zinc oxide, or barium strontium titanate.

11. The resonator of claim 1 or 2, wherein the piezoelectric transducer comprises an interdigitated transducer.

12. The resonator of claim 1, further comprising a Fabry-Perot cavity, comprising two opposing acoustic reflector end mirrors, in the membrane and wherein the piezoelectric transducer resides outside of the cavity and wherein the standing wave resonance is formed in the cavity.

13. The resonator of claim 12 or 2, wherein the end mirrors comprise a 1D Bragg mirror comprising a stack of quarter wavelength layers of materials with alternate high and low acoustic impedance.

14. The resonator of claim 13, wherein the 1D Bragg mirror comprises silicon dioxide and silicon carbide.

15. The resonator of claim 12 or 2, wherein the end mirrors comprise a 2D or 3D phononic crystal comprising a periodic array of high acoustic impedance scattering inclusions in a low acoustic impedance background matrix.

16. The resonator of claim 15, wherein the phononic crystal comprises tungsten and silicon dioxide.

17. The resonator of claim 12 or 2, wherein the end mirrors comprise a 2D phononic crystal comprising a periodic array of air holes in a solid background matrix.

18. The resonator of claim 17, wherein the solid background matrix comprises silicon carbide.

19. The resonator of claim 1 or 2, further comprising a second piezoelectric transducer disposed on the membrane and adapted to receive the fundamental or overtone mode lateral acoustic wave.

\* \* \* \* \*